US007755459B2

(12) United States Patent
Nguyen et al.

(10) Patent No.: US 7,755,459 B2
(45) Date of Patent: Jul. 13, 2010

(54) MICRO-SWITCHING DEVICE AND METHOD OF MANUFACTURING THE SAME

(75) Inventors: Anh Tuan Nguyen, Ho Chi Minh (VN); Tadashi Nakatani, Kawasaki (JP); Satoshi Ueda, Kawasaki (JP); Yu Yonezawa, Yokohama (JP); Naoyuki Mishima, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 12/007,630

(22) Filed: Jan. 14, 2008

(65) Prior Publication Data

US 2008/0174390 A1 Jul. 24, 2008

(30) Foreign Application Priority Data

Jan. 18, 2007 (JP) ............................. 2007-009360

(51) Int. Cl.
*H01P 1/10* (2006.01)
*B81B 3/00* (2006.01)

(52) U.S. Cl. ....................................... 333/262; 333/105

(58) Field of Classification Search ................. 333/101, 333/103, 104, 105, 262; 335/78; 200/181
See application file for complete search history.

(56) References Cited

U.S. PATENT DOCUMENTS 6,875,936 B1 4/2005 Suzuki et al.
7,535,326 B2 * 5/2009 Nakatani et al. .............. 335/78
7,540,968 B2 * 6/2009 Nguyen et al. ................. 216/2
2003/0183887 A1 10/2003 Lee et al.
2003/0227361 A1 12/2003 Dickens et al.
2004/0173872 A1 9/2004 Park et al.
2005/0225921 A1 10/2005 Nakatani et al.
2006/0208612 A1 9/2006 Takayama et al.
2008/0142348 A1 * 6/2008 Nguyen et al. .............. 200/275

FOREIGN PATENT DOCUMENTS

JP 2000-348595 12/2000
JP 2004-1186 1/2004
JP 2004-311394 11/2004
JP 2005-528751 9/2005
JP 2005-293918 10/2005
JP 2005-302711 10/2005
JP 2006210250 A * 8/2006

* cited by examiner

*Primary Examiner*—Dean O Takaoka
(74) *Attorney, Agent, or Firm*—Kratz, Quintos & Hanson, LLP

(57) ABSTRACT

A micro-switching device includes a fixing portion, a movable portion, a first electrode with first and second contacts, a second electrode with a third contact contacting the first contact, and a third electrode with a fourth contact opposing the second contact. In manufacturing the micro-switching device., the first electrode is formed on a substrate, and a sacrifice layer is formed on the substrate to cover the first electrode. Then, a first recess and a shallower second recess are formed in the sacrifice layer at a position corresponding to the first electrode. The second electrode is formed to have a portion opposing the first electrode via the sacrifice layer, and to fill the first recess. The third electrode is formed to have a portion opposing the first electrode via the sacrifice layer; and to fill the second recess. Thereafter the sacrifice layer is removed.

14 Claims, 26 Drawing Sheets

MICRO-SWITCHING DEVICE AND METHOD OF MANUFACTURING THE SAME

BACKGROUND OF THE INVENTION.

1. Field of the Invention

The present invention relates to a micro-switching device manufactured by a MEMS technique.

2. Description of the Related Art

In the technical field of wireless communication equipments such as a mobile phone, the increase components required to be incorporated in the equipment for achieving higher performance has been giving rise to a growing demand for RF circuits of smaller size. In order to meet this demand, a technique called micro-electromechanical systems (hereinafter, MEMS) has been employed for size reduction of various components constituting the circuit.

One of such components is a MEMS switch. The MEMS switch is a switching device that includes components fabricated in reduced sizes based on the MEMS technique, such as a pair of contacts that mechanically opens and closes for switching operation, and a driving mechanism that causes the pair of contacts to perform the mechanical switching operation, to name a few. The MEMS switch generally achieves higher isolation in an open state and lower insertion loss in a closed state than a switching device that includes a PIN diode or MESFET, especially when switching a high frequency signal of the order of GHz. This is because the open state is achieved by a mechanical opening motion between the contacts, and also because the mechanical switch incurs smaller parasitic capacitance. The MEMS switch is disclosed, for example, in patent documents such as JP-A-2004-1186, JP-A-2004-311394, JP-A-2005-293918, and JP-A-2005-528751.

FIGS. 25 to 29 depict a micro-switching device X4, as an example of the conventional micro-switching devices. FIG. 25 is a plan view of the micro-switching device X4, and FIG. 26 is a fragmentary plan view thereof. FIGS. 27 to 29 are cross-sectional views taken along the line XXVII-XXVII, XXVIII-XXVIII, and XXIX-XXIX in FIG. 25, respectively.

The micro-switching device X4 includes a base substrate S4, a fixing portion 41, a movable portion 42, a contact electrode 43, a pair of contact electrodes 44A, 44B (indicated by dash-dot lines in FIG. 26), a driving electrode 45, and a driving electrode 46 (indicated by dash-dot lines in FIG. 26).

The fixing portion 41 is joined to the base substrate S4 via a partition layer 47, as shown in FIGS. 27 to 29. The fixing portion 41 and the base substrate S4 are formed of monocrystalline silicon, and the partition layer 47 is formed of silicon dioxide.

The movable portion 42 includes, as shown in FIGS. 26 and 29, a stationary end 42*a* fixed to the fixing portion 41 and a free end 42*b*, and is disposed to extend along the base substrate S4 from the stationary end 42*a*, and surrounded by a slit 48. The movable portion 42 is formed of monocrystalline silicon.

The contact electrode 43 is located close to the free end 42*b* of the movable portion 42, as seen from FIG. 26. Each of the contact electrodes 44A, 44B is formed partially upright on the fixing portion 41 as shown in FIGS. 27 and 29, and includes a portion opposing the contact electrode 43. The contact electrodes 44A, 44B are connected to a predetermined circuit to be switched, via an interconnector (not shown). The contact electrodes 43, 44A, 44B are formed of an appropriate conductive material.

The driving electrode 45 is disposed to extend over a part of the movable portion 42 and of the fixing portion 41, as shown in FIG. 26. The driving electrode 46, as seen from FIG. 28, includes two upright posts jointed to the fixing portion 41 and a horizontal portion connected to the respective posts so as to span over the driving electrode 45. The driving electrode 46 is also grounded by a conductor (not shown). The driving electrodes 45, 46 are formed of an appropriate conductive material.

In the micro-switching device X4 thus constructed, when a potential is applied to the driving electrode 45, static attraction is generated between the driving electrodes 45, 46. When the applied potential is sufficiently high, the movable portion 42 extending along the base substrate S4 is elastically deformed until the contact electrode 43 makes contact with the contact electrodes 44A, 44B. That is how the micro-switching device X4 enters a closed state. Under the closed state, the contact electrode 43 serves as an electrical bridge between the pair of contact electrodes 44A, 44B, thereby allowing a current to run between the contact electrodes 44A, 44B. Thus, for example an on state of a high frequency signal can be attained.

On the other hand, in the micro-switching device X4 under the closed state, disconnecting the potential to the driving electrode 45, thereby canceling the static attraction acting between the driving electrodes 45, 46 causes the movable portion 42 to return to its natural state, so that the contact electrode 43 is separated from the contact electrodes 44A, 44B. That is how the micro-switching device X4 enters an open state as shown in FIGS. 27 and 29. Under the open state, the pair of contact electrodes 44A, 44B is electrically isolated and hence the current is inhibited from running between the contact electrodes 44A, 44B. Thus, for example an off state of the high frequency signal can be attained.

The micro-switching device X4 has the drawback that the contact electrode 43 suffers relatively large fluctuation in orientation toward the contact electrodes 44A, 44B.

In the manufacturing process of the micro-switching device X4, the contact electrode 43 is formed by a thin film formation technique on the movable portion 42, or on a position on the material substrate where the movable portion is to be formed. More specifically, a sputtering or a vapor deposition process is performed to deposit a predetermined conductive material on a predetermined surface, and the deposited layer is patterned so as to form the contact electrode 43. The contact electrode 43 thus formed via the thin film formation technique is prone to incur some internal stress. The internal stress often provokes deformation of the movable portion 42 at a position where the contact electrode 43 is adhered and the vicinity thereof, along with the contact electrode 43, as exaggeratedly illustrated in FIG. 30(*a*)-(*b*). Such deformation leads to relatively large difference (i.e. fluctuation) in orientation of the contact electrode 43 toward the contact electrodes 44A, 44B among each device.

The large fluctuation in orientation of the contact electrode 43 toward the-contact electrodes 44A, 44B leads to a higher potential to be applied to the driving electrode 45 in order to achieve the closed state of the micro-switching device X4. This is because it becomes necessary to set a sufficiently high driving voltage, to ensure that the device normally works irrespective of the extent of the orientation of the contact electrode 43 within an assumed range. Consequently, from the viewpoint of reduction of the driving voltage of the device, it is not desirable that the contact electrode 43 (movable contact electrode) has large fluctuation in orientation toward the contact electrodes 44A, 44B (stationary contact electrode).

SUMMARY OF THE INVENTION

The present invention has been proposed under the foregoing circumstances. It is therefore an object of the present invention to provide a micro-switching device capable of suppressing fluctuation in orientation of a movable contact electrode toward a stationary contact electrode. It is another object of the present invention to provide a method of manufacturing such a micro-switching device.

A first aspect of the present invention provides a micro-switching device. The micro-switching device comprises a fixing portion, a movable portion, a movable contact electrode, a first stationary contact electrode, a second stationary contact electrode, and a driving mechanism. The movable portion includes a first surface and a second surface opposite to the first surface, and is disposed to extend horizontally from its stationary end which is fixed to the fixing portion. The movable contact electrode is provided on the first surface of the movable portion, and includes a first contact portion and a second contact portion. The first stationary contact electrode, joined to the fixing portion, includes a third contact portion which can be brought into contact with the first contact portion of the movable contact electrode even while the device is in an open state (off state). The second stationary contact electrode, also jointed to the fixing portion, includes a fourth contact portion disposed to face the second contact portion of the movable contact electrode. The driving mechanism causes the movable portion to move or to be elastically deformed so that the second contact portion and the fourth contact portion come into contact with each other.

In the micro-switching device described above, the first contact portion of the movable contact electrode and the third contact portion of the first stationary contact electrode can be brought into contact with each other in the open state (off state). In this open state (i.e., with the first and the third contact portions held in contact with each other), the freedom of deformation of the movable contact electrode (or of the movable portion upon which this contact electrode is formed) for internal stress occurring in the electrode is lessened in comparison with the case where the first contact portion and the third contact portion are spaced apart from each other. With this feature, the micro-switching device of the present invention is suitable for suppressing the fluctuation in orientation of the movable contact electrode with respect to the first and the second stationary contact electrode. The suppressing of the fluctuation in orientation of the movable contact electrode contributes to reducing the driving voltage of the micro-switching device.

According to a second aspect of the present invention, the above-mentioned first and third contact portions are permanently connected to each other. With such an arrangement, the fluctuation in orientation of the movable contact electrode with respect to the first and second stationary contact electrodes can be effectively suppressed.

Preferably, the movable contact electrode may comprise a first projecting portion which includes the first contact portion. Further the movable contact electrode may comprise a second projecting portion having a shorter projecting length than the first projecting portion, where the second projecting portion includes the second contact portion. Such a structure is advantageous for attaining a temporary or permanent contacting state between the first contact portion of the movable contact electrode and the third contact portion of the stationary contact electrode in the open state of the device.

Preferably, the first stationary contact electrode may comprise a third projecting portion which includes the third contact portion, while the second stationary contact electrode may comprise a fourth projecting portion which has a shorter projecting length than the third projecting portion and which includes the fourth contact portion. Such a structure is advantageous for bringing the first contact portion and the third contact portion into mutual contact in the open state of the device.

Preferably, the movable contact electrode may be spaced apart from the stationary end in a predetermined offset direction on the first surface of the movable portion, and further the first contact portion and the second contact portion may be spaced apart in a direction intersecting the offset direction. The driving mechanism may include a driving force generation region on the first surface of the movable portion, where the center of gravity of the driving force generation region is closer to the second contact portion than to the first contact portion of the movable contact electrode. Such a structure is advantageous for reducing the driving voltage for the device.

Preferably, the distance between the stationary end of the movable portion and the first contact portion of the movable contact electrode may be different from the distance between the stationary end and the second contact portion are different. For example, the distance between the stationary end and the second contact portion may be shorter than the distance between the stationary end and the first contact portion. The movable portion may be of a bent structure. Preferably, the center of gravity of the driving force generation region and the second contact portion may be located on the same side with respect to an imaginary line passing through the midpoint of the length of the stationary end and the midpoint between the first contact portion and the second contact portion. Such a configuration is advantageous for reducing the driving voltage for the device.

Preferably, the micro-switching device according to the present invention may include a static driving mechanism for the driving mechanism mentioned above, where the static driving mechanism may consist of a movable driving electrode provided on the first surface of the movable portion and a stationary driving electrode having a portion opposing the movable-driving electrode and joined to the fixing portion.

Preferably, the driving mechanism may have a multilayer structure formed of a first electrode layer provided on the first surface of the movable portion, a second electrode layer, and a piezoelectric layer disposed between the first and the second electrode layer. The micro-switching device of the present invention may include such a piezoelectric driving mechanism for the driving mechanism.

Preferably, the driving mechanism may have a multilayer structure formed of a plurality of material layers provided on the first surface of the movable portion and each having a different thermal expansion coefficient. The micro-switching device of the present invention may include such a thermal type driving mechanism for the driving mechanism.

A third aspect of the present invention provides a method of manufacturing a micro-switching device according to the first aspect of the present invention. The method comprises the steps of: forming the movable contact electrode on a substrate; forming a sacrifice layer on the substrate to cover the movable contact electrode; forming a first recess and a second recess shallower than the first recess in the sacrifice layer at a position corresponding to the movable contact electrode; forming the first stationary contact electrode having a portion opposing the movable contact electrode via the sacrifice layer in a manner such that the first stationary contact electrode fills the first recess; forming the second stationary contact electrode having a portion opposing the movable contact electrode via the sacrifice layer in a manner such that the second stationary contact electrode fills the second recess; and removing the sacrifice layer.

A fourth aspect of the present invention provides a method of manufacturing a micro-switching device according to the second aspect of the present invention. The method comprises the steps of: forming the movable contact electrode on a substrate; forming a sacrifice layer on the substrate to cover the movable contact electrode; forming a through-hole for partially exposing the movable portion and forming a recess both in the sacrifice layer at a position corresponding to the movable contact electrode; forming the first stationary contact electrode having a portion opposing the movable contact electrode via the sacrifice layer in a manner such that the first stationary contact electrode fills the through-hole; forming the second stationary contact electrode having a portion opposing the movable contact electrode via the sacrifice layer in a manner such that the second stationary contact electrode fills the recess; and removing the sacrifice layer.

DETAILED DESCRIPTION OF THE PREFERRED EMBODIMENTS

Figure 1:
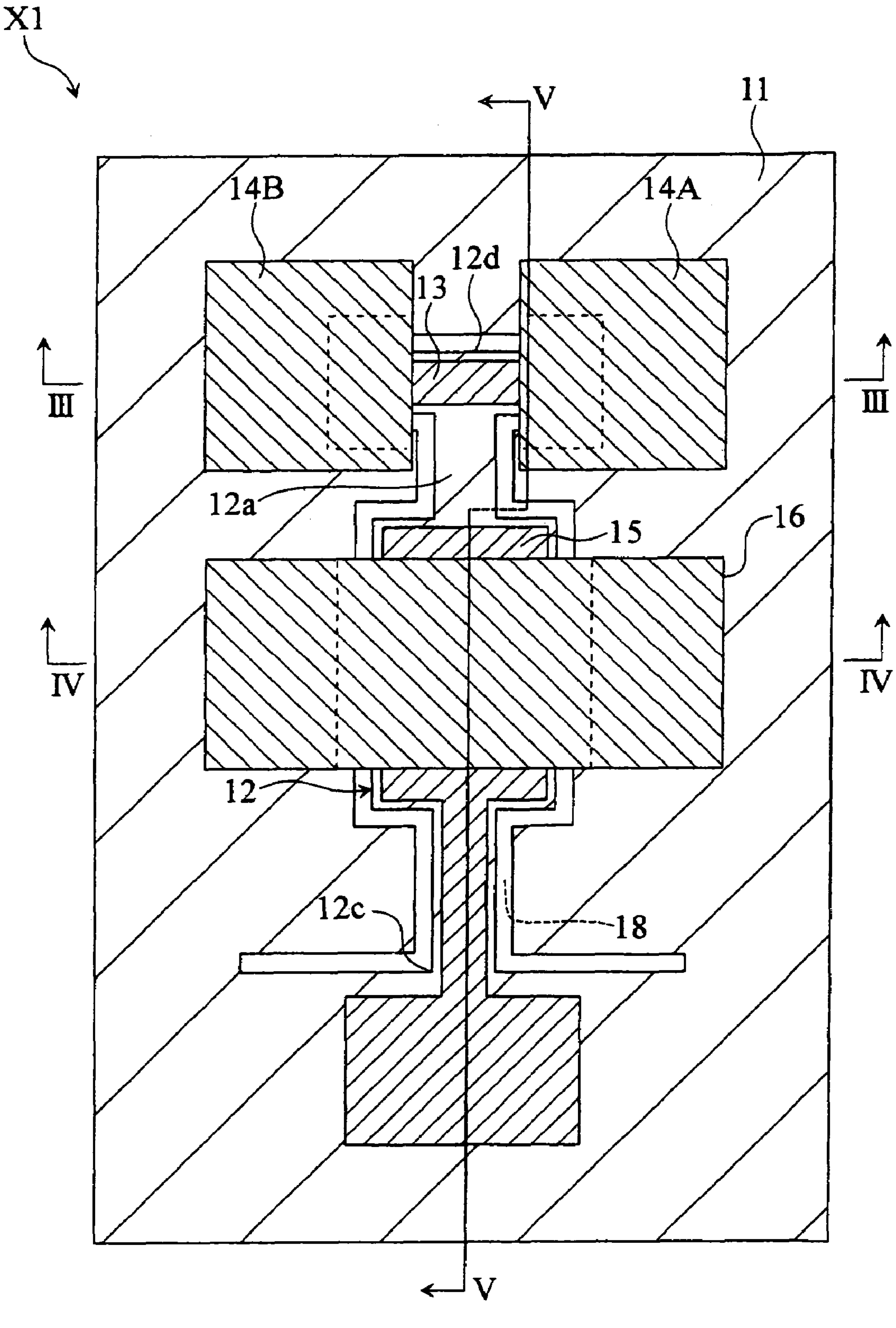
FIG. 1 is a plan view showing a micro-switching device according to a first embodiment of the present invention.
Figure 2:
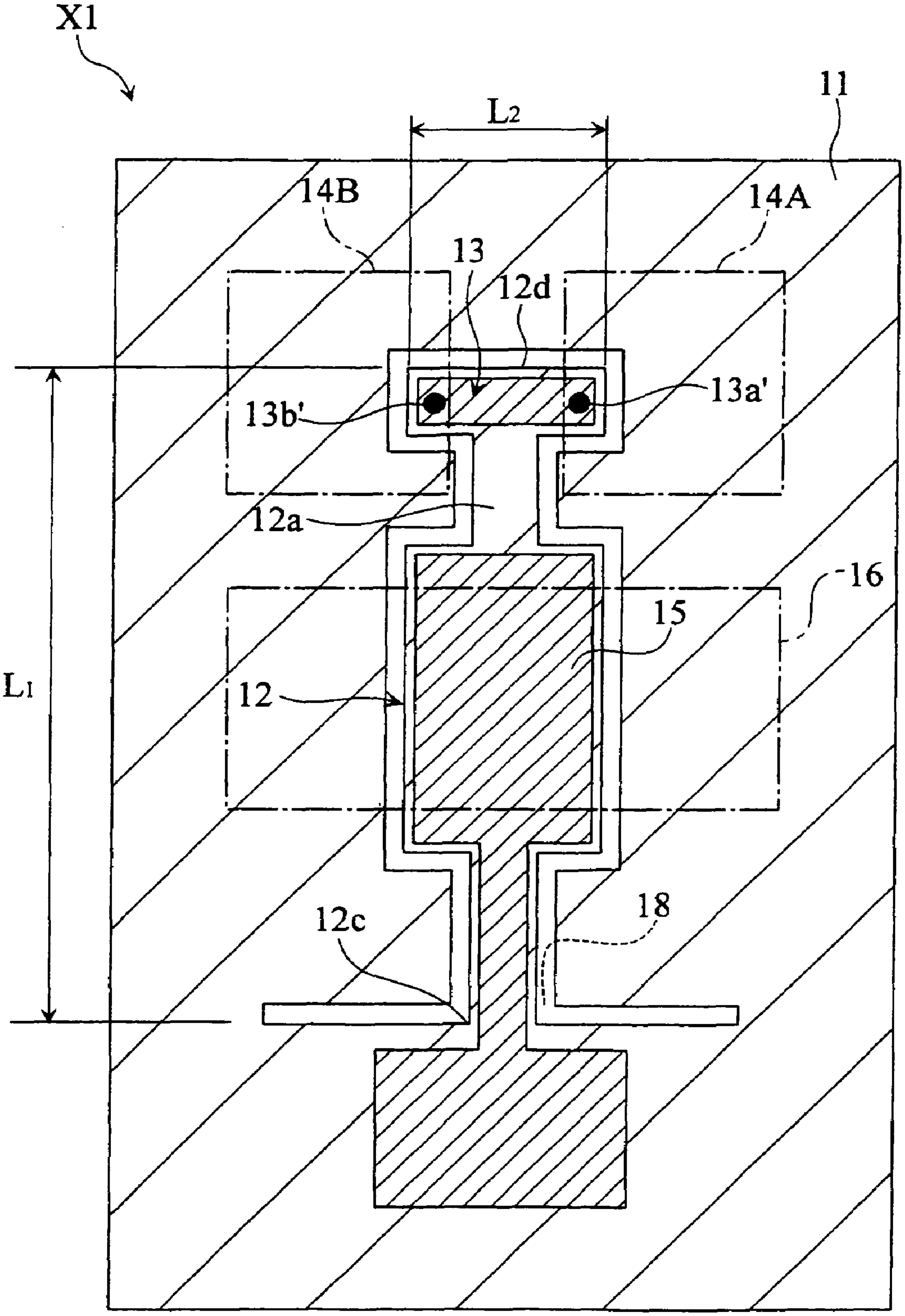
FIG. 2 is a fragmentary plan view of the micro-switching device shown in FIG. 1.
Figure 3:
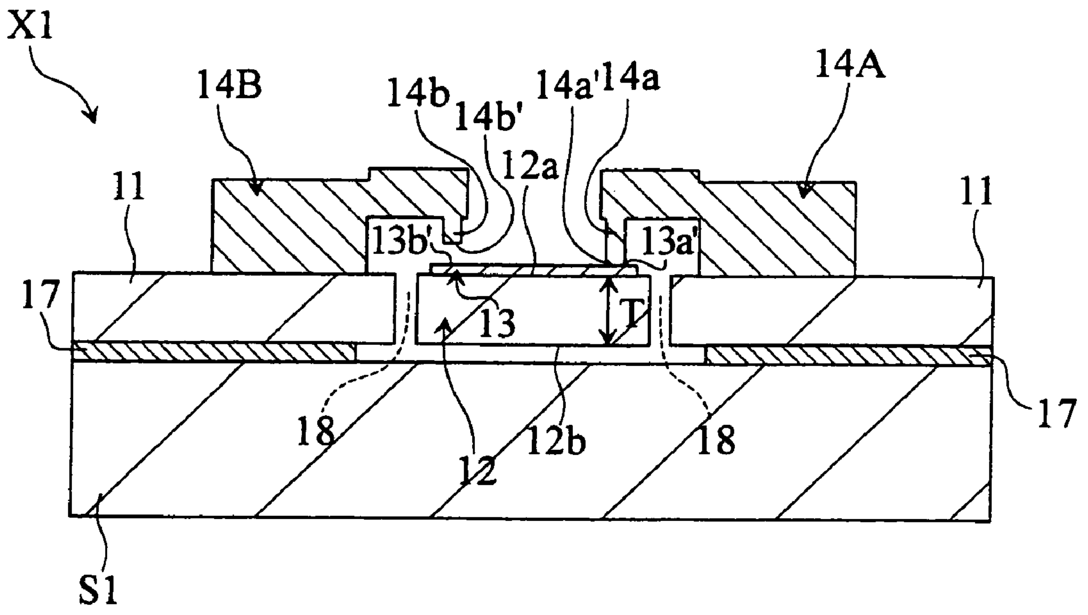
FIG. 3 is a cross-sectional view taken along a line III-III in FIG. 1.
Figure 4:
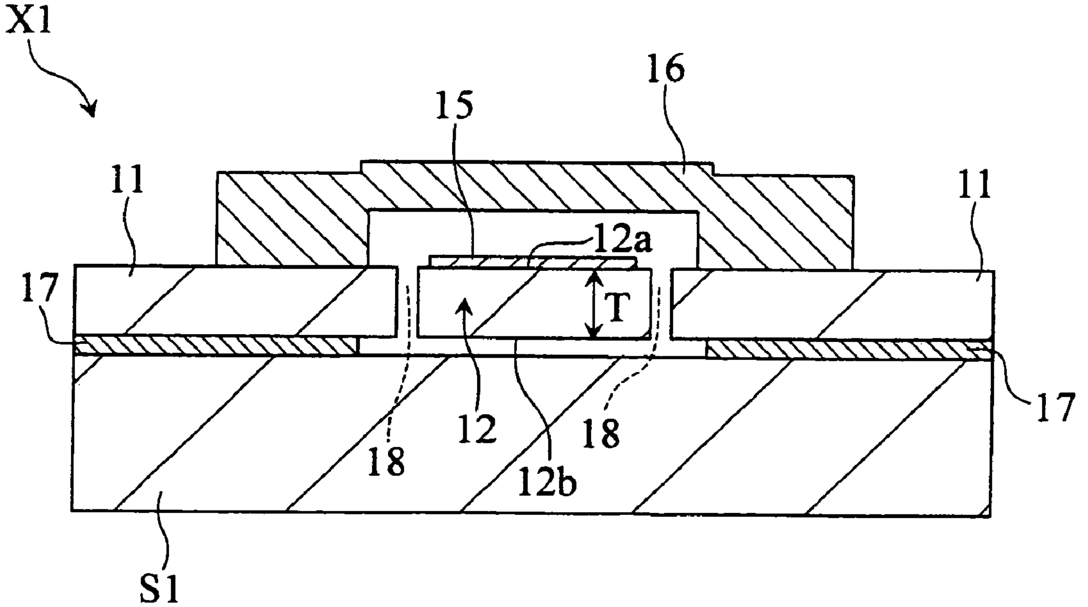
FIG. 4 is a cross-sectional view taken along a line IV-IV in FIG. 1.
Figure 5:
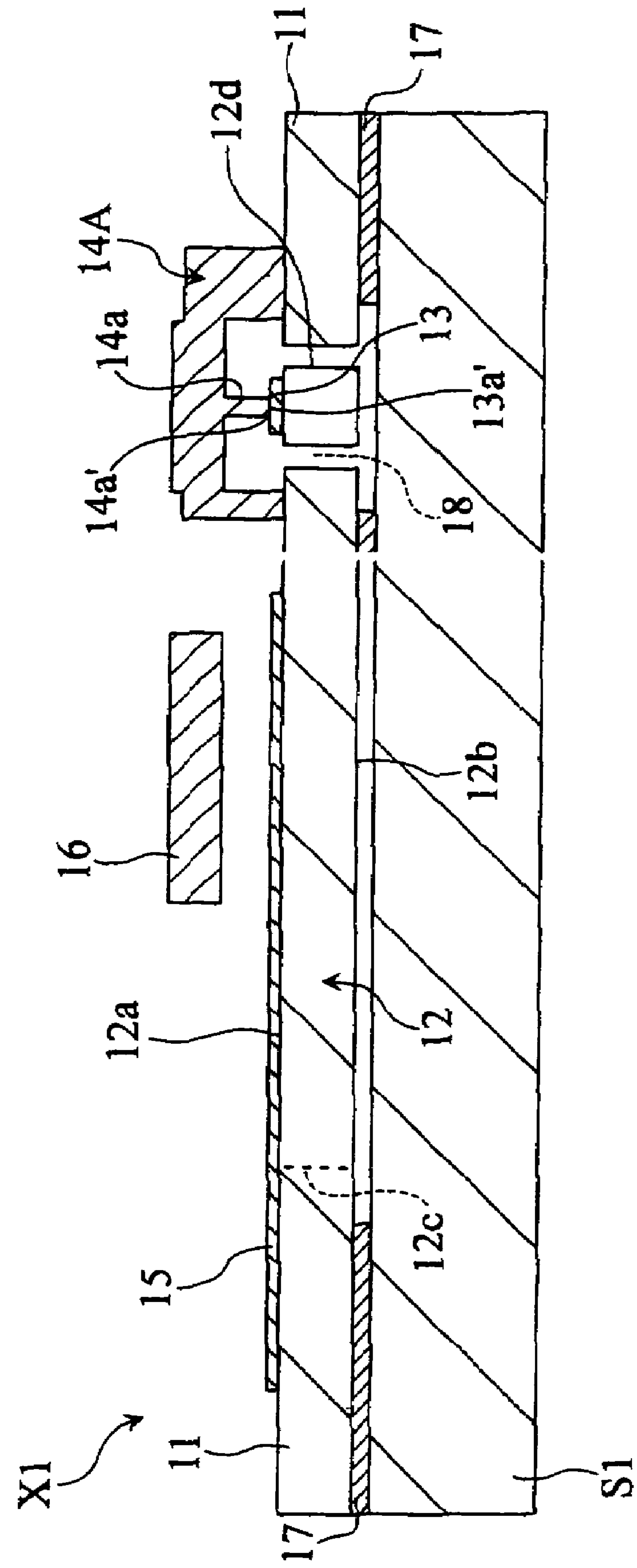
FIG. 5 is a cross-sectional view taken along a line V-V in FIG. 1.

FIGS. 1 to 5 show a micro-switching device X1 according to a first embodiment of the present invention. FIG. 1 is a plan view showing the micro-switching device X1, and FIG. 2 is a fragmentary plan view of the micro-switching device X1. FIGS. 3 to 5 are cross-sectional views taken along lines III-III, IV-IV, and V-V in FIG. 1, respectively.

The micro-switching device X1 includes a base substrate S1, a fixing portion 11, a movable portion 12, a contact electrode 13, a pair of contact electrodes 14A, 14B (indicated by dash-dot lines in FIG. 2), a driving electrode 15, and a driving electrode 16 (indicated by dash-dot lines in FIG. 2).

The fixing portion 11 is joined to the base substrate S1 via a partition layer 17, as shown in FIGS. 3 to 5. The fixing portion 11 is formed of a silicon material such as monocrystalline silicon. It is preferable that the silicon material constituting the fixing portion 11 has resistivity not lower than 1000 Ω·cm. The partition layer 17 is formed of silicon dioxide, for example.

The movable portion 12 includes, as shown in FIGS. 1, 2 and 5, a first surface 12*a* and a second surface 12*b*, as well as a stationary end 12*c* fixed to the fixing portion 11 and a free end 12*d*, and is disposed to extend along the base substrate S1 from the stationary end 12*a*, and surrounded by the fixing portion 11 via a slit 18. The thickness T of the movable portion 12 (shown in FIGS. 3 and 4) is, for example, not greater than 15 μm. The length $L_1$ of the movable portion 12 shown in FIG. 2 is 650 to 1000 μm for example, and the length $L_2$ is 200 to 400 μm, for example. The slit 18 has a width of 1.5 to 2.5 μm for example. The movable portion 12 is formed of, for example, monocrystalline silicon.

The contact electrode 13 is a movable contact electrode and, as shown in FIG. 2, is located on the first surface 12*a* of the movable portion 12, at a position close to the free end 12*d* (in other words, the contact electrode 13 is spaced from the stationary end 12*c* of the movable portion 12). The contact electrode 13 includes contact portions 13*a*', 13*b*'. For the sake of explicitness of the drawing, the contact portions 13*a*', 13*b*' are indicated by solid circles in FIG. 2. The contact electrode 13 has a thickness of 0.5 to 2.0 μm, for example. Such thickness range is advantageous for reducing the resistance of the contact electrode 13. The contact electrode 13 is formed of an appropriate conductive material, and has a multilayer structure including, for example, a Mo underlying layer and an Au layer provided thereon.

The contact electrodes 14A, 14B are first and second stationary contact electrodes, respectively. Each of the electrodes 14A, 14B is formed upright on the fixing portion 11 and includes a downward projecting portion 14*a* or 14*b* as shown in FIGS. 3 and 5. The tip (lower end) of the projecting portion 14*a* serves as a contact portion 14*a*', which is disposed in contact with the contact portion 13*a*' on the contact electrode 13. The tip of the projecting portion 14*b* serves as a contact portion 14*b*', disposed to face the contact portion 13*b*' on the contact electrode 13. The projecting portion 14*a* is longer in projecting length than the projecting portion 14*b*. For example, the projecting portion 14*a* has a projection length of 1 to 4 μm, while the projecting portion 14*b* may have a projection length of 0.8 to 3.8 μm, but should always be shorter than the projecting portion 14*a*. The contact electrodes 14A, 14B are connected to a predetermined circuit to be switched, via a certain interconnector (not shown). The contact electrodes 14A, 14B may be formed of the same material as that of the contact electrode 13.

The driving electrode 15 is, as shown in FIG. 2, disposed to extend over a part of the movable portion 12 and of the fixing portion 11. The driving electrode 15 has a thickness of, for example, 0.5 to 2 μm. The driving electrode 15 may be formed of Au.

The driving electrode 16 serves to generate static-attraction (driving force) in the space between the driving electrode 16 and the driving electrode 15, and is formed so as to span over the driving electrode 15 with the respective ends connected to the fixing portion 11, as shown in FIG. 4. The driving electrode 16 has a thickness not less than 15 μm, for example. The driving electrode 16 is grounded by a conductor (not shown). The driving electrode 16 may be formed of the same material as that of the contact electrode 15.

FIGS. 6-9 are cross-sectional views showing the same portion of the micro-switching device X1 as FIGS. 3 and 4, and representing a manufacturing process thereof. In this process, firstly a material substrate S1' shown in FIG. 6(*a*) is prepared. The material substrate S1' is a silicon-on-insulator (SOI) substrate, and has a multilayer structure including a first layer 101, a second layer 102, and an intermediate layer 103 interposed therebetween. In this embodiment, for example, the thickness of the first layer 101 is 15 μm, the thickness of the second layer 102 is 5105 μm, and the thickness of the intermediate layer 103 is 4 μm. The first layer 101 is formed of monocrystalline silicon for example, to be processed to turn into the fixing portion 11 and the movable portion 12. The second layer 102 is formed of monocrystalline silicon for example, to be processed to turn into the base substrate S1. The intermediate layer 103 is formed of silicon dioxide for example, to be processed for formation of the partition layer 17.

Figure 6:
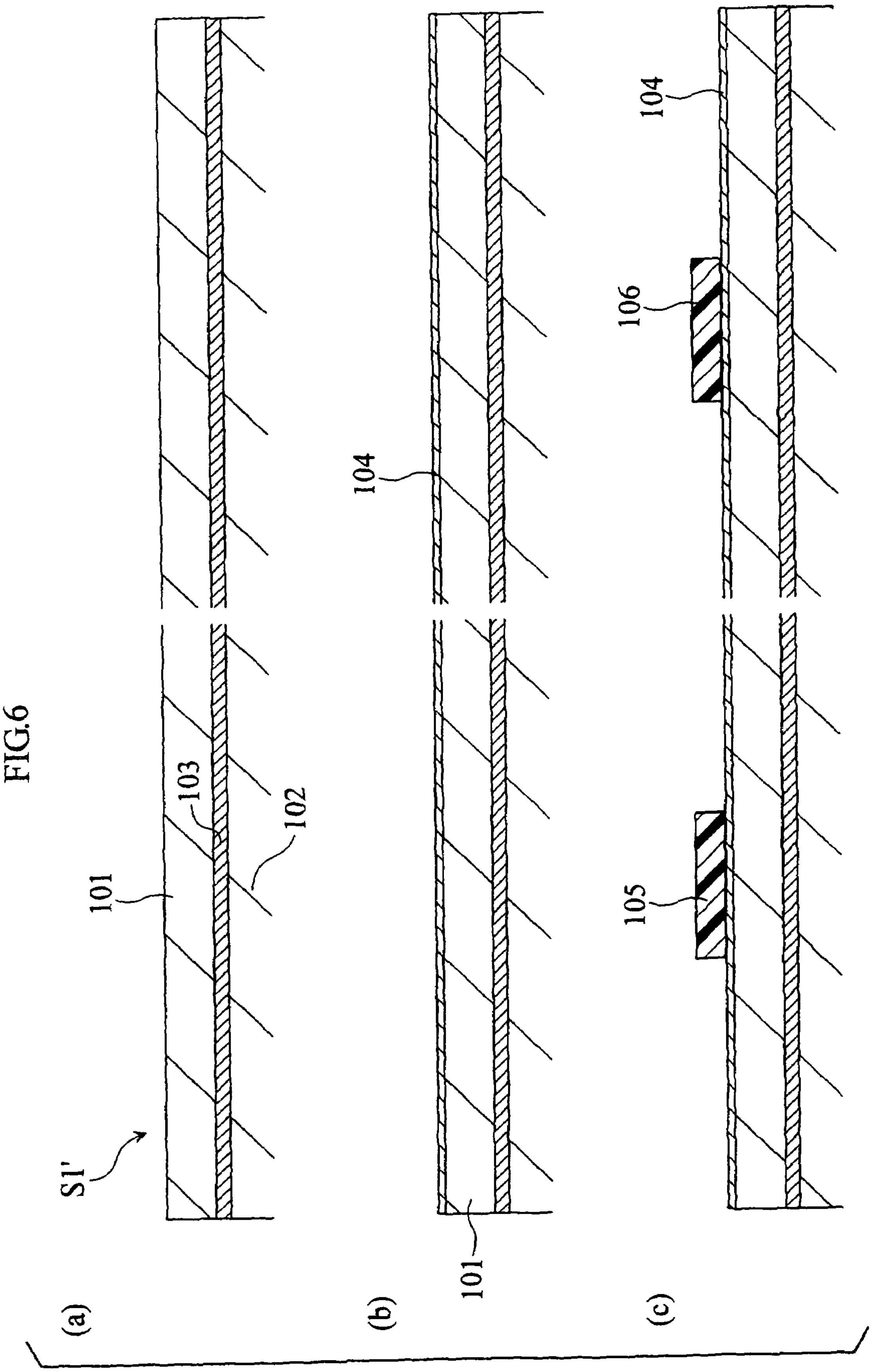
FIG. 6 shows, in section, steps of a manufacturing process of the micro-switching device shown in FIG. 1.

Then a conductor layer 104 is formed on the first layer 101, as shown in FIG. 6(*b*). For example, a sputtering process is performed to deposit Mo on the first layer 101, and Au is deposited on the Mo layer. The Mo layer has a thickness of 30 nm for example, and the Au layer 500 nm, for example.

A photolithography process is then performed so as to form resist patterns 105, 106 on the conductor layer 104, as shown in FIG. 6(*c*). The resist pattern 105 has a pattern shape corresponding to the contact electrode 13. The resist pattern 106 has a pattern shape corresponding to the driving electrode 15.

Figure 7:
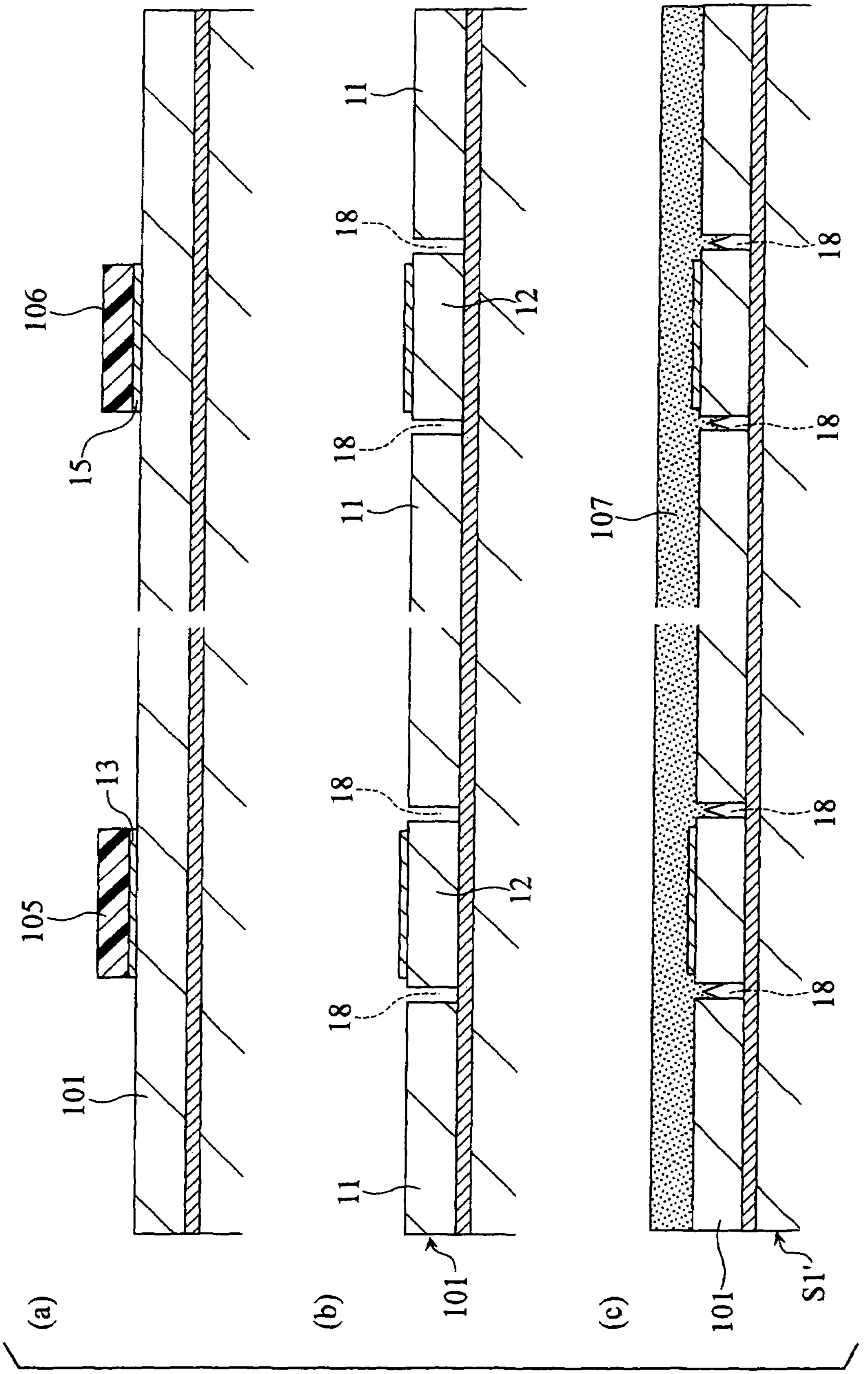
FIG. 7 shows, in section, manufacturing steps subsequent to those shown in FIG. 6.

Proceeding to FIG. 7(*a*), an etching process is performed on the conductor layer 104 utilizing the resist patterns 105, 106 as the mask, to thereby form the contact electrode 13 and the driving electrode 15 on the first layer 101. For example, an ion milling process (physical etching with Ar ion) may be adopted in this process. The ion milling process may also be adopted for the subsequent etching processes for metal materials.

After removing the resist pattern 105, 106, an etching process is performed on the first layer 101 to form the slit 18, as shown in FIG. 7(*b*). Specifically, a photolithography process is performed to thereby form a predetermined resist pattern on the first layer 101, after which an anisotropic etching process is performed on the first layer 101 utilizing the resist pattern as the mask. Here, a reactive ion etching process may be adopted. At this stage, the fixing portion 11 and the movable portion 12 are formed in the predetermined pattern.

Then as shown in FIG. 7(*c*), a sacrifice layer 107 is formed over the first layer 101 of the material substrate S1, so as to cover the slit 18. Suitable materials for the sacrifice layer include silicon dioxide. Suitable methods to form the sacrifice layer 107 include a plasma CVD process and a sputtering process.

Figure 8:
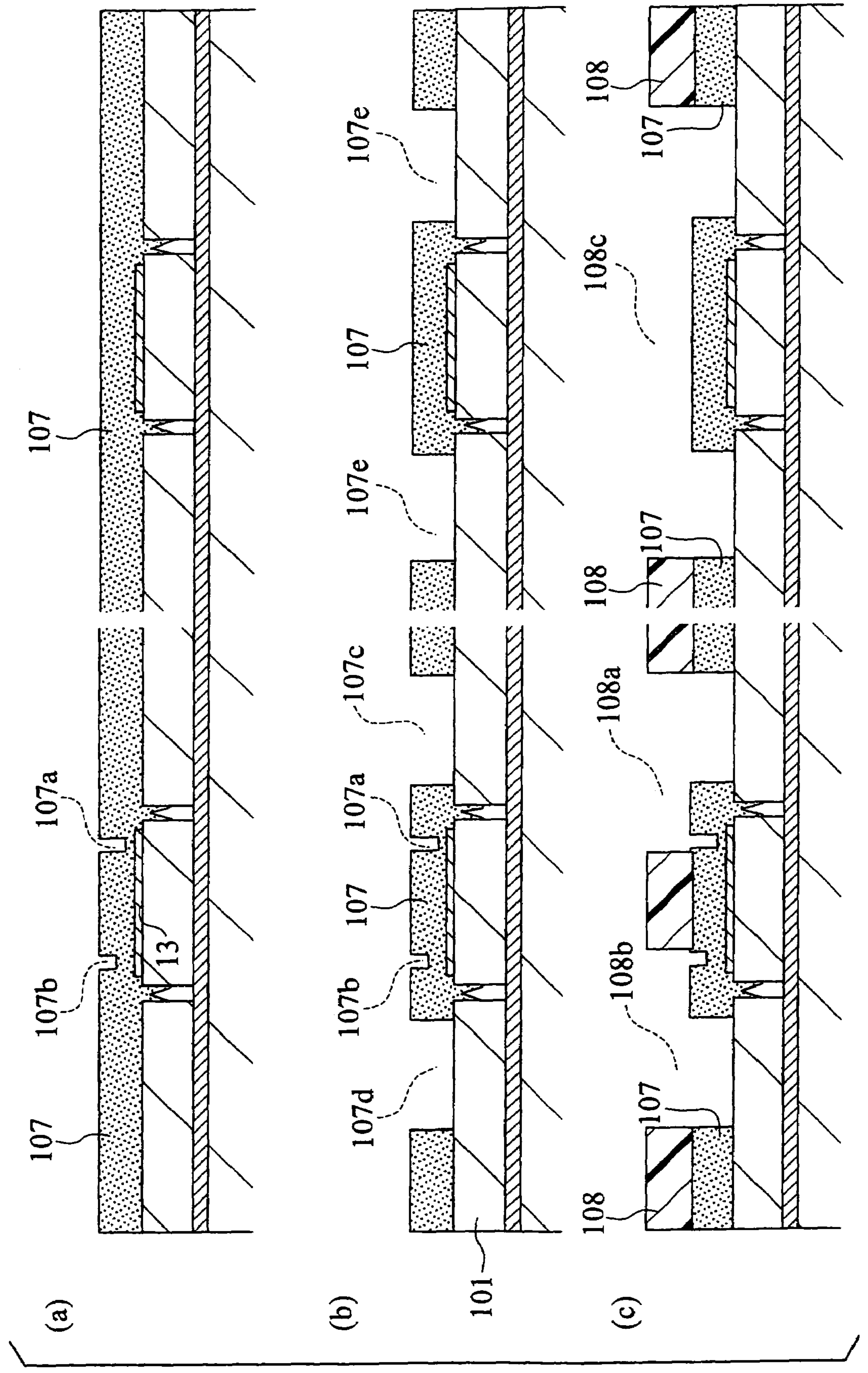
FIG. 8 shows, in section, manufacturing steps subsequent to those shown in FIG. 7.

Referring now to FIG. 8(*a*), recessed portions 107*a*, 107*b* are formed on the sacrifice layer 107 at positions corresponding to the contact electrode 13. More specifically, a photolithography process is performed to thereby form a predetermined resist pattern on the sacrifice layer 107, after which an etching process is performed on the sacrifice layer 107 utilizing the resist pattern as the mask. Here, a wet etching process may be adopted. For the wet etching process, buffered hydrofluoric acid (BHF) may be employed as the etching solution. The BHF may also be adopted for the subsequent etching process performed on the sacrifice layer 107. The recessed portion 107*a* serves for formation of the projecting portion 14*a* of the contact electrode 14A. The distance between the bottom portion of the recessed portion 107*a* and the contact electrode 13, i.e. the thickness of the sacrifice layer 107 between the recessed portion 107*a* and the contact electrode 13 is, for example, not thicker than 12 μm. In FIG. 8(*a*) and the subsequent drawings, the thickness of the sacrifice layer 107 between the recessed portion 107*a* and the contact electrode 13 is exaggerated. The recessed portion 107*b* serves for formation of the projecting portion 14*b* of the contact electrode 14*b*, and is shallower than the recessed portion 107*a*.

Then the sacrifice layer 107 is patterned so as to form openings 107*c*, 107*d*, 107*e*, as shown in FIG. 8(*b*). More specifically, a photolithography process is performed to thereby form a predetermined resist pattern on the sacrifice layer 107, after which an etching process is performed on the sacrifice layer 107 utilizing the resist pattern as the mask. Here, a wet etching process may be adopted. The openings 107*c*, 107*d* serve to expose the regions of the fixing portion 11 to which the contact electrodes 14A, 14B are to be joined, respectively. The opening 107*e* serves to expose the region of the fixing portion 11 to which the driving electrode 16 is to be joined.

After forming an underlying layer (not shown) for electrical conduction on the surface of the material substrate S1' where the sacrifice layer 107 is provided, a resist pattern 108 is then formed as shown in FIG. 8(*c*). The underlying layer may be formed, for example, by a sputtering process for depositing Mo in a thickness of 50 nm, and depositing Au thereon in a thickness of 500 nm. The resist pattern 108 includes openings 108*a*, 108*b* corresponding to the contact electrodes 14A, 14B, and an opening 108*c* corresponding to the driving electrode 16.

Figure 9:
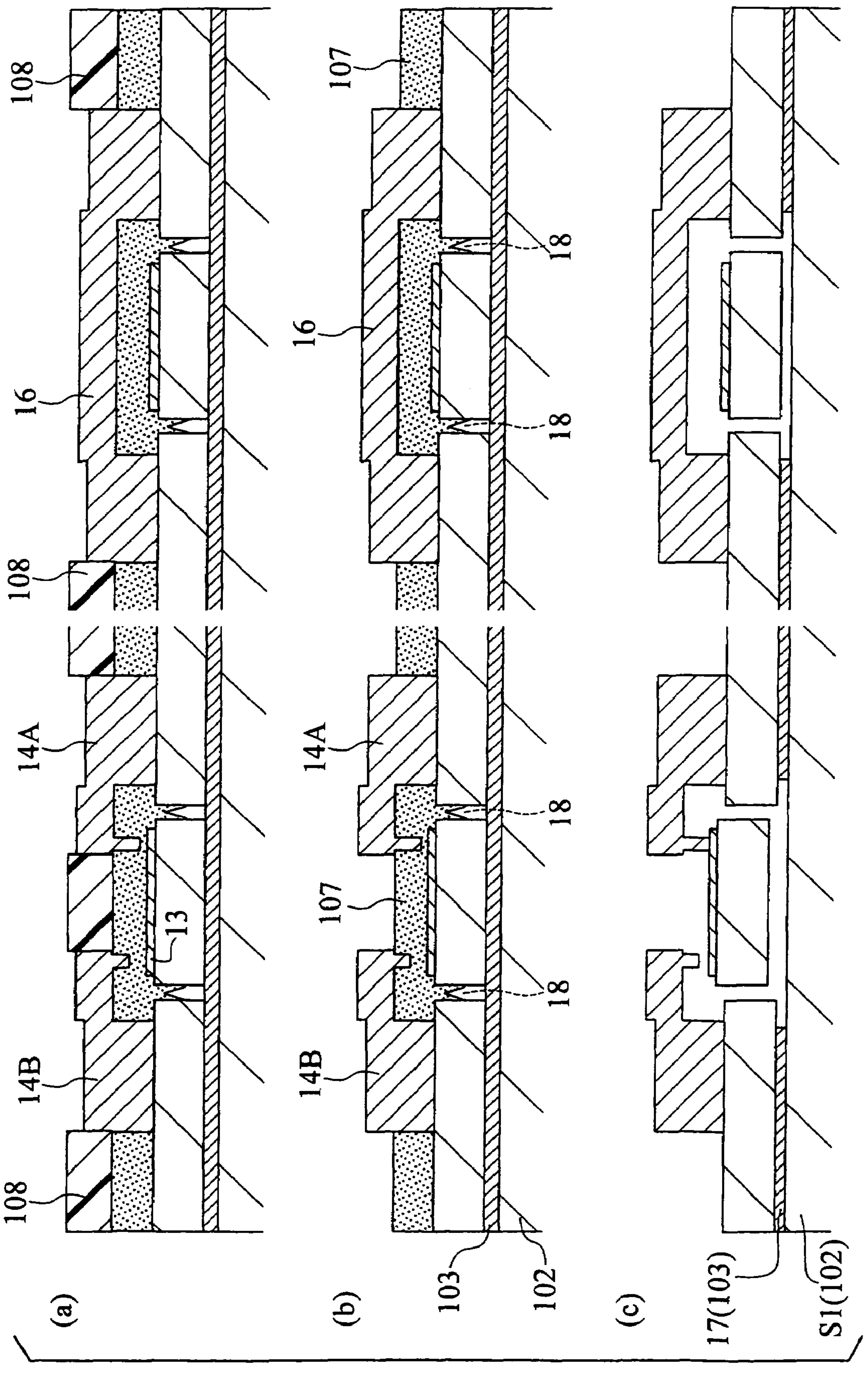
FIG. 9 shows, in section, manufacturing steps subsequent to those shown in FIG. 7.

Proceeding to FIG. 9(*a*), the contact electrodes 14A, 14B and the driving electrode 16 are formed. More specifically, an electric plating process is performed to grow Au on the underlying layer, in the regions exposed through the openings 107_a_ to 107_e_, and 108_a_ to 108_c_.

Then the resist pattern 108 is removed by etching, as shown in FIG. 9(_b_). After that, exposed portions of the underlying layer for electric plating are removed by etching. For these removal steps, a wet etching process may be employed.

Referring now to FIG. 9(_c_), the sacrifice layer 107 and a part of the intermediate layer 103 are removed. Specifically, a wet etching process is performed on the sacrifice layer 107 and the intermediate layer 103. By this etching process the sacrifice layer 107 is removed first, and then a part of the intermediate layer 103 is removed at and near the position corresponding to the slit 18. This etching process is stopped after a gap is properly formed between the entirety of the movable portion 12 and the second layer 102. Thus, the remaining portion of the intermediate layer 103 serves as the partition layer 17. Also, the second layer 102 constitutes the base substrate S1.

By the foregoing process, the movable portion 12 incurs warp and displaced toward the contact electrodes 14A, 14B, as exaggeratedly shown in FIG. 9(_c_). In the driving electrode 15 formed as above bears internal stress that has emerged by the formation process, and such internal stress causes the driving electrode 15, as well as the movable portion 12 joined thereto, to warp. More specifically, the movable portion 12 incurs deformation or warp that biases the free end 12_d_ of the movable portion 12 comes closer to the contact electrode 14. Consequently, the movable portion 12 is deformed until the contact portion 13_a_' of the contact electrode 13 and the contact portion 14_a_' on the projecting portion 14_a_ of the contact electrode 14A come into mutual contact. The projecting portion 14_a_ is preferably formed with a sufficient length, so that a pressing force acts between the contact portions 13_a_', 14_a_' in mutual contact.

Then a wet etching- is performed, if necessary, to remove residue of the underlying layer (for example, Mo layer) stuck to the lower surface of the contact electrodes 14A, 14B and the driving electrode 16, after which a supercritical drying process is performed to dry the entire device. Employing the supercritical drying process enables effectively avoiding a sticking phenomenon that the movable portion 12 sticks to the base substrate S1.

The micro-switching device X1 can be obtained by the foregoing process. This method allows forming the contact electrodes 14A, 14B including the portions opposing the contact electrode 13 in a sufficient thickness on the sacrifice layer 107 by plating. Such method allows, therefore, forming the pair of contact electrodes 14A, 14B in a sufficient thickness for achieving the desired low resistance. The contact electrodes 14A, 14B formed in the sufficient thickness are advantageous for reducing insertion loss of the micro-switching device X1.

In the micro-switching device X1 thus manufactured, when a potential is applied to the driving electrode 15, static attraction is generated between the driving electrodes 15, 16. When the applied potential is sufficiently high, the movable portion 12 moves, or is elastically deformed, until the contact portion 13_b_' of the contact electrode 13 and the contact portion 14_b_' on the projecting portion 14_b_ of the contact electrode 14B come into mutual contact. That is how the micro-switching device X1 enters a closed state. Under the closed state, the contact electrodes 13 serves as an electrical bridge between the pair of contact electrodes 14A, 14B, thereby allowing a current to run between the contact electrodes 14A, 14B. Such closing action of the switch can realize, for example, an on-state of a high frequency signal.

On the other hand, in the micro-switching device X1 under the closed state, disconnecting the potential to the driving electrode 15, thereby canceling the static attraction acting between the driving electrodes 15, 16 causes the movable portion 12 to return to its natural state, so that the contact portion 13_b_' of the contact electrode 13 is separated from the contact portion 14_b_' on the projecting portion 14_b_ of the contact electrode 14B. That is how the micro-switching device X1 enters an open state as shown in FIGS. 3 and 5. Under the open state, the pair of contact electrodes 14A, 14B is electrically isolated and hence the current is inhibited from running between the contact electrodes 14A, 14B. Such opening action of the switch can realize, for example, an off state of the high frequency signal. The micro-switching device X1 in such open state can be again switched to the closed state or the on state, by the above closing action.

In the micro-switching device X1, the contact portion 13_b_' of the contact electrode 13 and the contact portion 14_a_' on the projecting portion 14_a_ of the contact electrode 14A are in mutual contact in the open state (off state). In the contact electrode 13 of the micro-switching device X1, configured to form such open state, and the movable portion 12 to which the contact electrode 13 is joined, the freedom of deformation due to the internal stress in the contact electrode 13 is depressed, compared with the case where the contact portions 13_a_' and 14_a_' are not in contact but spaced from each other. Accordingly, the micro-switching device X1 is capable of suppressing the fluctuation in orientation of the contact electrode 13 (movable contact electrode) toward the contact electrodes 14A, 14B (stationary contact electrode). Suppressing the fluctuation in orientation of the contact electrode 13 toward the contact electrodes 14A, 14B contributes to reducing the driving voltage of the. micro-switching device X1.

In the micro-switching device X1, the contact electrode 13 may include a first projecting portion that projects toward the contact electrode 14A so as to be in contact with the contact electrode 14A even in the open state of the device, and a second projecting portion that projects toward the contact electrode 14B to such an extent that the second projecting portion does not reach the contact electrode 14B in the open state of the device, instead of the projecting portions 14_a_, 14_b_ of the contact electrodes 14A, 14B. To manufacture the micro-switching device X1 having such structure, the first and the second projecting portion may be formed on the contact electrode 13, for example after the process described referring to FIG. 7(_b_), after which the sacrifice layer 107 may be formed so as to cover the first and the second projecting portion, by the process described referring to FIG. 7(_c_). In this case, the recessed portions 107_a_, 107_b_ described referring to FIG. 8(_a_) are not formed.

Figure 10:
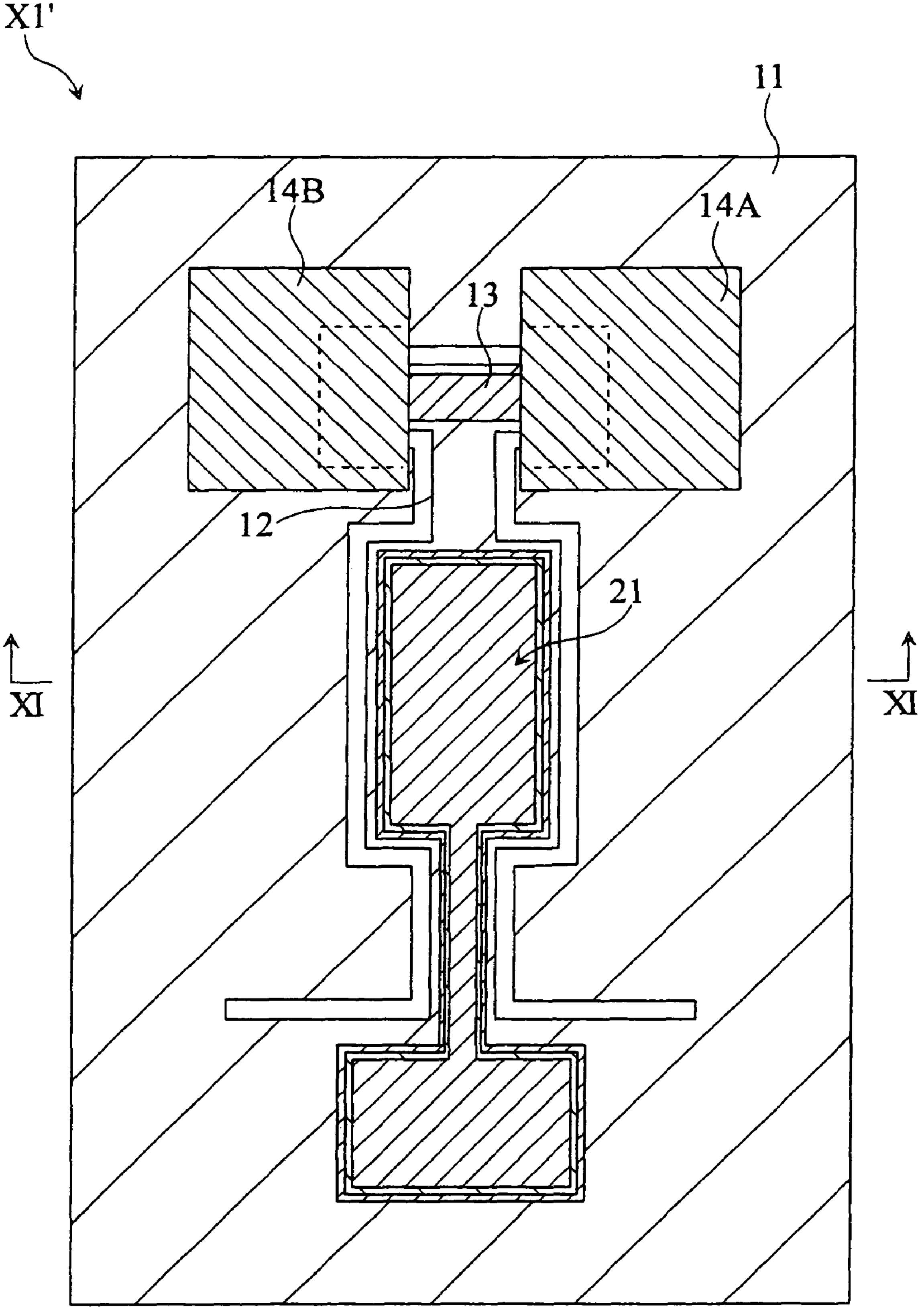
FIG. 10 is a plan view showing a variation of the micro-switching device according to the first embodiment of the present invention.
Figure 11:
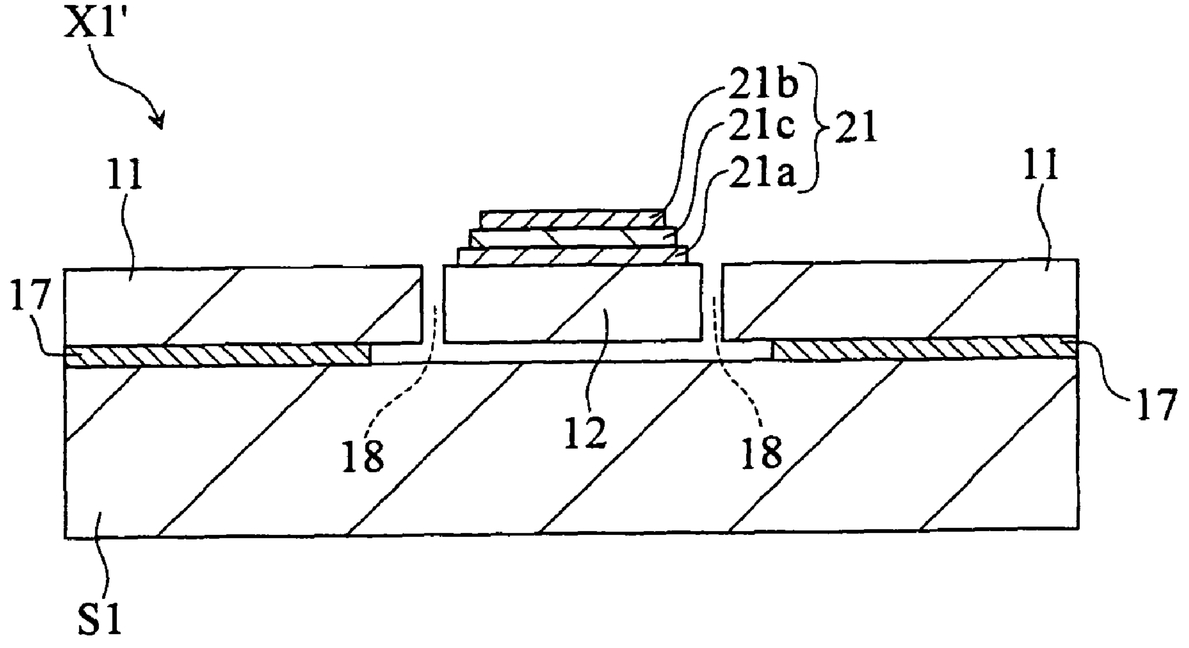
FIG. 11 is a cross-sectional view taken along a line XI-XI in FIG. 10.

FIGS. 10 and 11 depict a micro-switching device X1' which is a variation of the micro-switching device X1. FIG. 10 is a plan view showing the micro-switching device X1', and FIG. 11 is a cross-sectional view taken along a line XI-XI in FIG. 10.

The micro-switching device X1' includes the base substrate S1, the fixing portion 11, the movable portion 12, the contact electrode 13, the pair of contact electrodes 14A, 14B, and a piezoelectric driving unit 21. The micro-switching device X1' is different from the micro-switching device X1 in including the piezoelectric driving unit 21 as the driving mechanism, in place of the driving electrodes 15, 16.

The piezoelectric driving unit 21 includes driving electrodes 21_a_, 21_b_, and a piezoelectric layer 21_c_ interposed therebetween. The driving electrodes 21_a_, 21_b_ each have a multilayer structure including, for example, a Ti underlying layer and an Au main layer. The driving. electrode 21_b_ is grounded by a conductor (not shown). The piezoelectric layer 21$c$ is formed of a piezoelectric material bearing a nature of being distorted when an electric field is applied (converse piezoelectric effect). Such piezoelectric materials include PZT (solid solution of $PbZrO_3$ and $PbTiO_3$), ZnO doped with Mn, ZnO, and AlN. The driving electrodes 21$a$, 21$b$ have a thickness of 0.55 μm, and the piezoelectric layer 21$c$ has a thickness of 1.5 μm, for example. Through the operation of the piezoelectric driving unit 21 thus configured, the closing action of the micro-switching device X1' can be achieved.

The piezoelectric driving unit 21 may be employed as the driving mechanism of the micro-switching device according to the present invention. In the micro-switching devices according to the subsequent embodiments also, the piezoelectric driving unit 21 may be employed as the driving mechanism.

Figure 12:
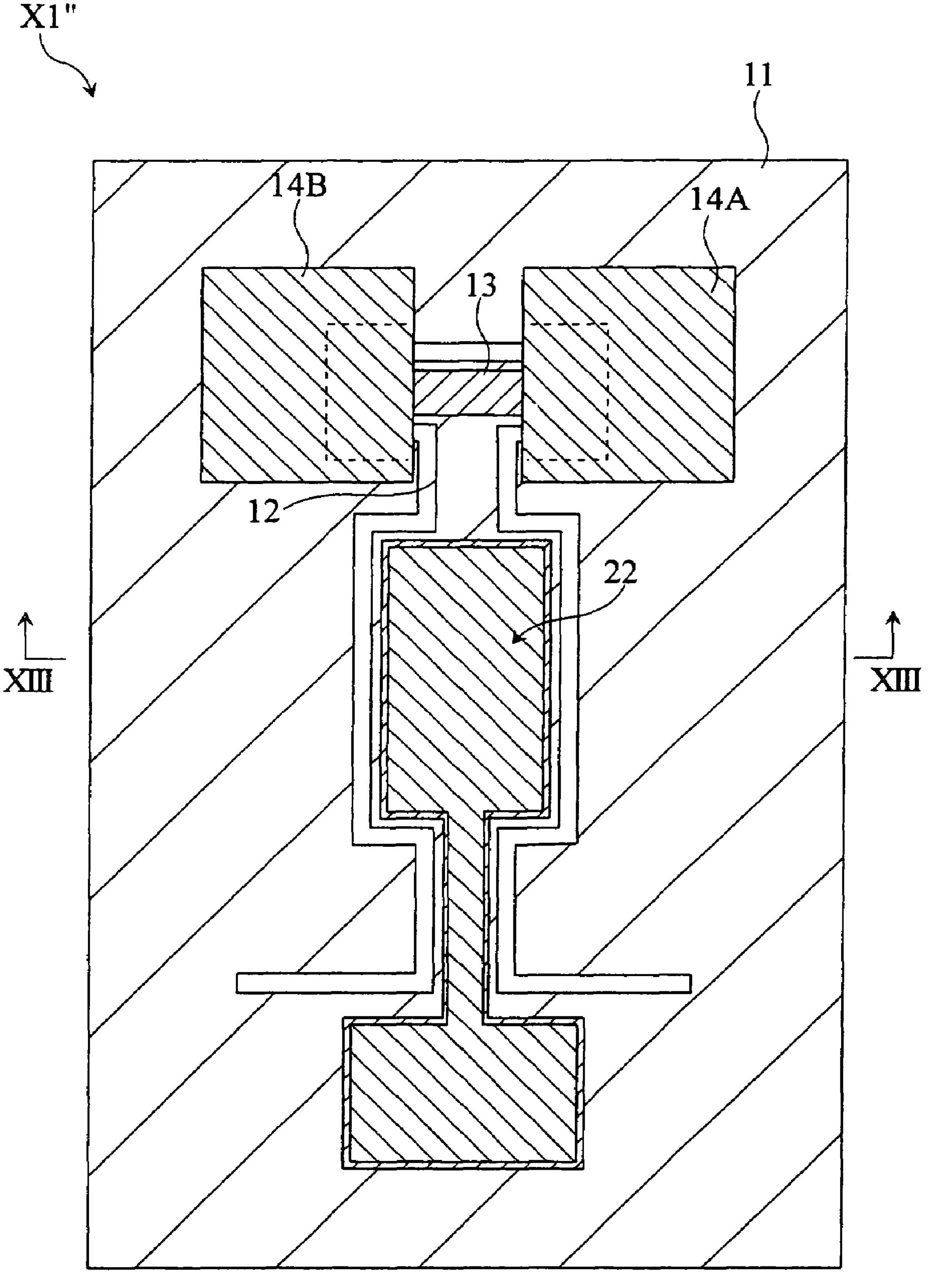
FIG. 12 is a plan view showing another variation of the micro-switching device according to the first embodiment of the present invention.
Figure 13:
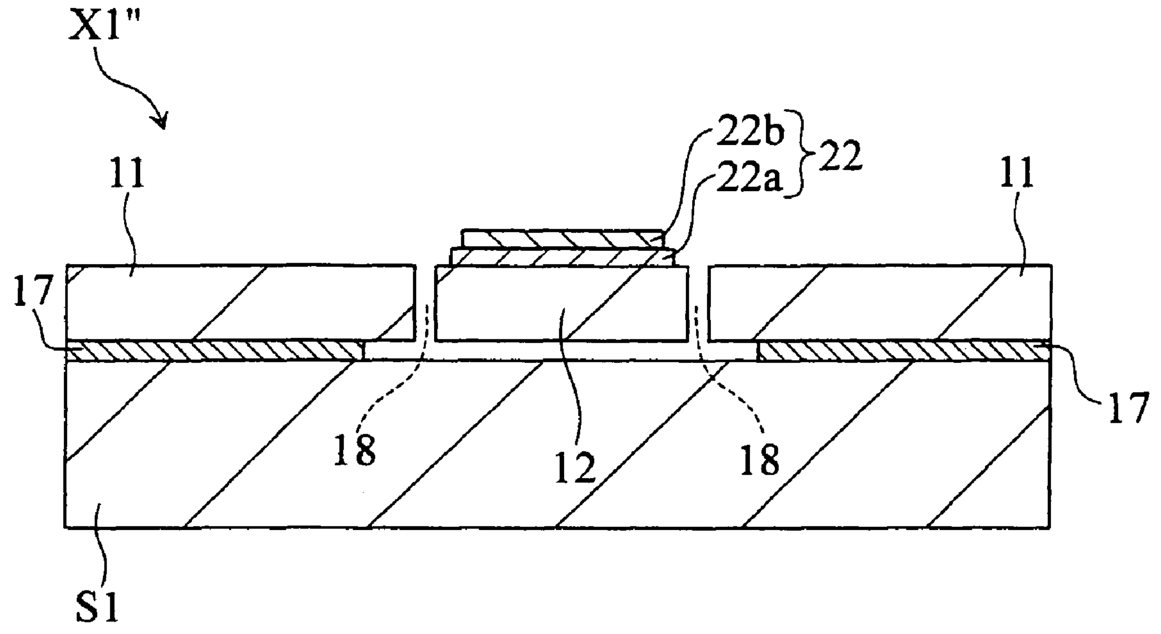
FIG. 13 is a cross-sectional view taken along a line XIII-XIII in FIG. 12.

FIGS. 12 and 13 depict a micro-switching device X1' which is another variation of the micro-switching device X1. FIG. 12 is a plan view showing the micro-switching device X1', and FIG. 13 is a cross-sectional view taken along a line XIII-XIII in FIG. 12.

The micro-switching device X1' includes the base substrate S1, the fixing portion 11, the movable portion 12, the contact electrode 13, the pair of contact electrodes 14A, 14B, and a thermal driving unit 22. The micro-switching device X1" is different from the micro-switching device X1 in including the thermal driving unit 22 as the driving mechanism, in place of the driving electrodes 15, 16.

The thermal driving unit 22 is a thermal type driving mechanism, and includes thermal electrodes 22$a$, 22$b$ of different thermal expansion coefficients. The thermal electrode 22$a$ disposed in direct contact with the movable portion 12 has a greater thermal expansion coefficient than the thermal electrode 22$b$. The thermal driving unit 22 is provided so that the thermal electrodes 22$a$, 22$b$ generate heat to thereby thermally expand, when power is supplied. The thermal electrode 22$a$ is formed of Au, an Fe alloy or a Cu alloy, for example. The thermal electrode 22$b$ is formed of, for example, an Al alloy.

The thermal driving unit 22 may be employed as the driving mechanism of the micro-switching device according to the present invention. In the micro-switching devices according to the subsequent embodiments also, the thermal driving unit 22 may be employed as the driving mechanism.

Figure 14:
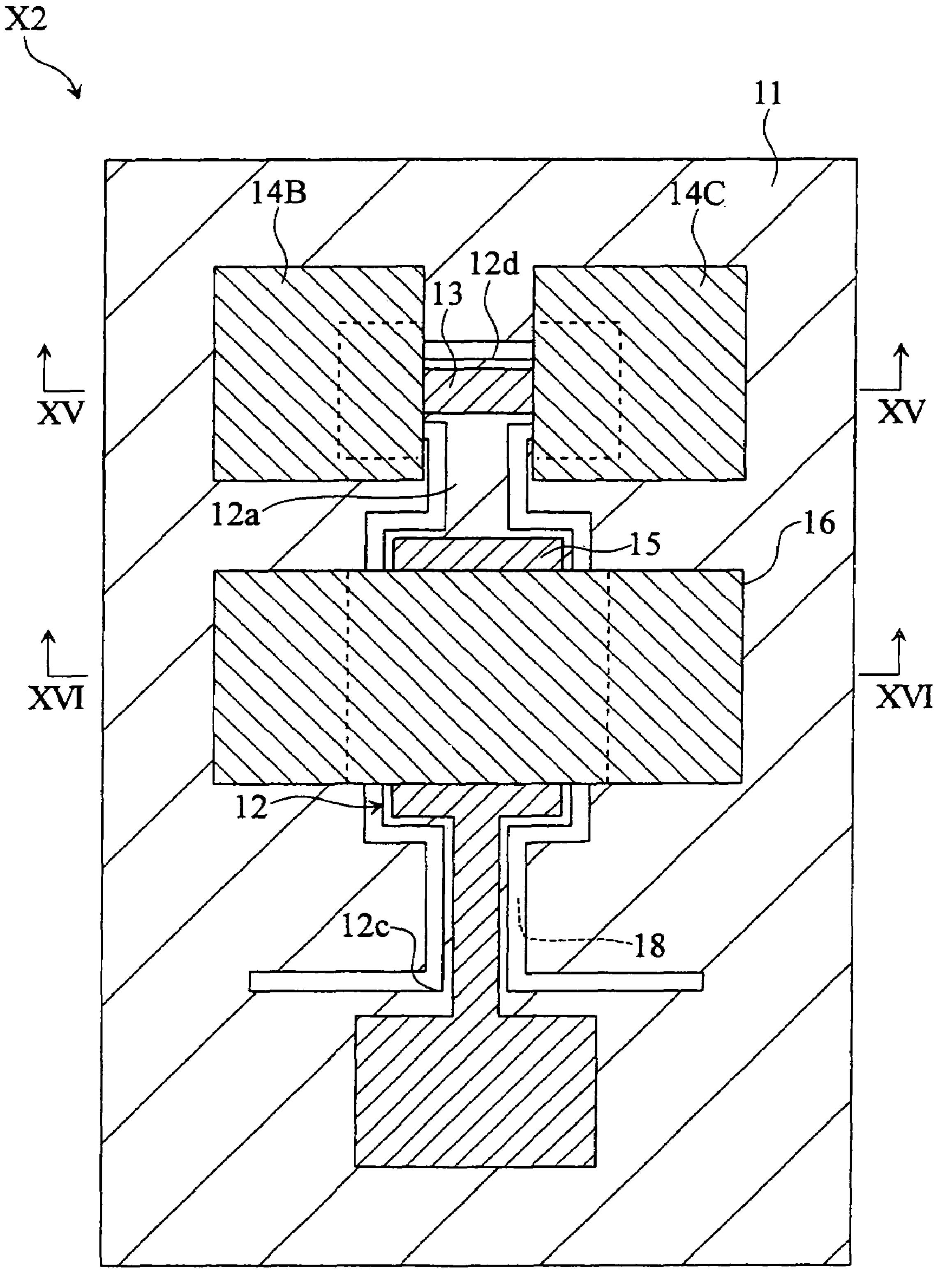
FIG. 14 is a plan view showing a micro-switching device according to a second embodiment of the present invention.
Figure 15:
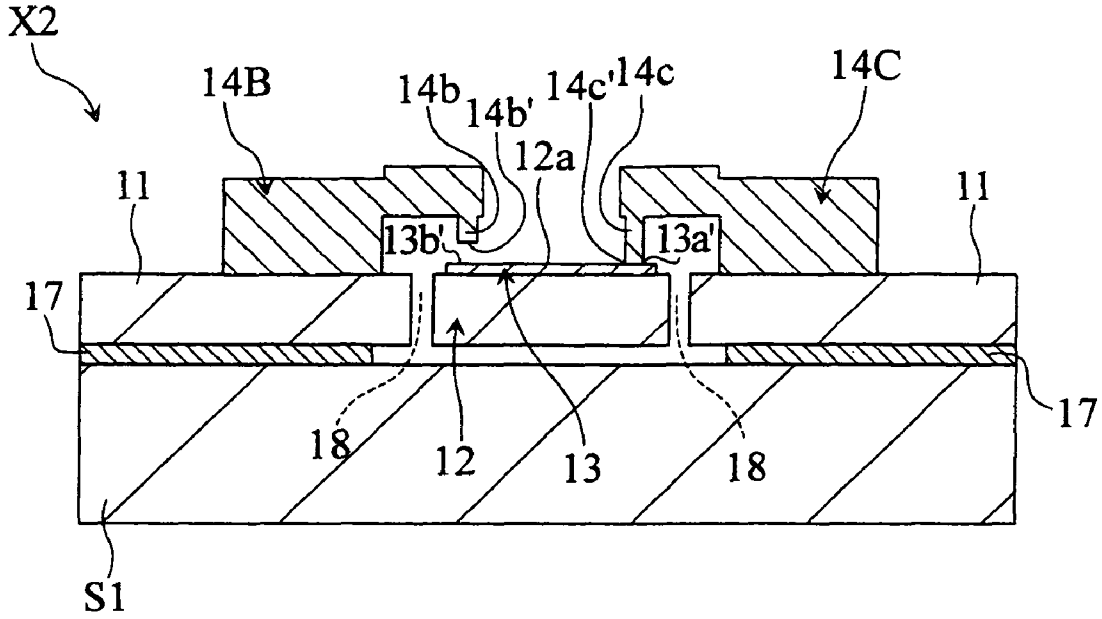
FIG. 15 is a cross-sectional view taken along a line XV-XV in FIG. 14.
Figure 16:
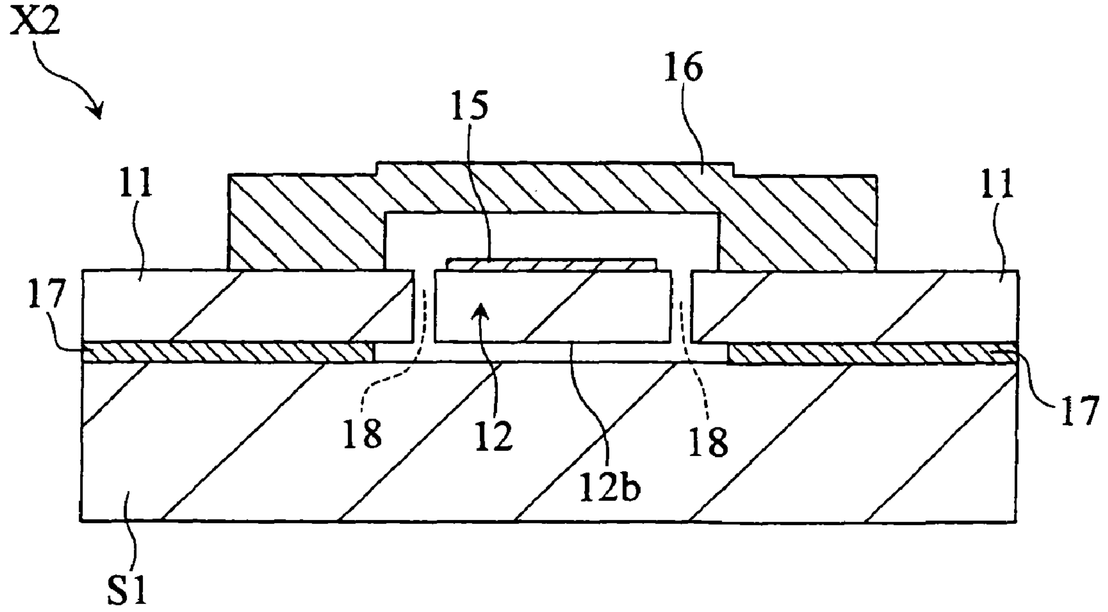
FIG. 16 is a cross-sectional view taken along a line XVI-XVI in FIG. 14.

FIGS. 14 to 16 depict a micro-switching device X2 according to a second embodiment of the present invention. FIG. 14 is a plan view showing the micro-switching device X2. FIGS. 15 and 16 are cross-sectional views taken along lines XV-XV and XVI-XVI in FIG. 14, respectively.

The micro-switching device X2 includes the base substrate S1, the fixing portion 11, the movable portion 12, the contact electrode 13, a pair of contact electrodes 14B, 14C, and the driving electrodes 15, 16. The micro-switching device X2 is different from the micro-switching device X1 in including the contact electrode 14C instead of the contact electrode 14A.

The contact electrode 14C is a first stationary contact electrode, formed upright on the fixing portion 11 and including a projecting portion 14$c$ as shown in FIG. 15. The tip portion of the projecting portion 14$c$ serves as a contact portion 14$c$', which is joined to the contact portion 13$a$' on the contact electrode 13. The contact electrode 14C is connected to a predetermined circuit to be switched, via an interconnector (not shown). The contact electrode 14C may be formed of the same material as that of the contact electrode 13. The remaining portion of the micro-switching device X2 has a similar structure to that of the micro-switching device X1.

Figure 17:
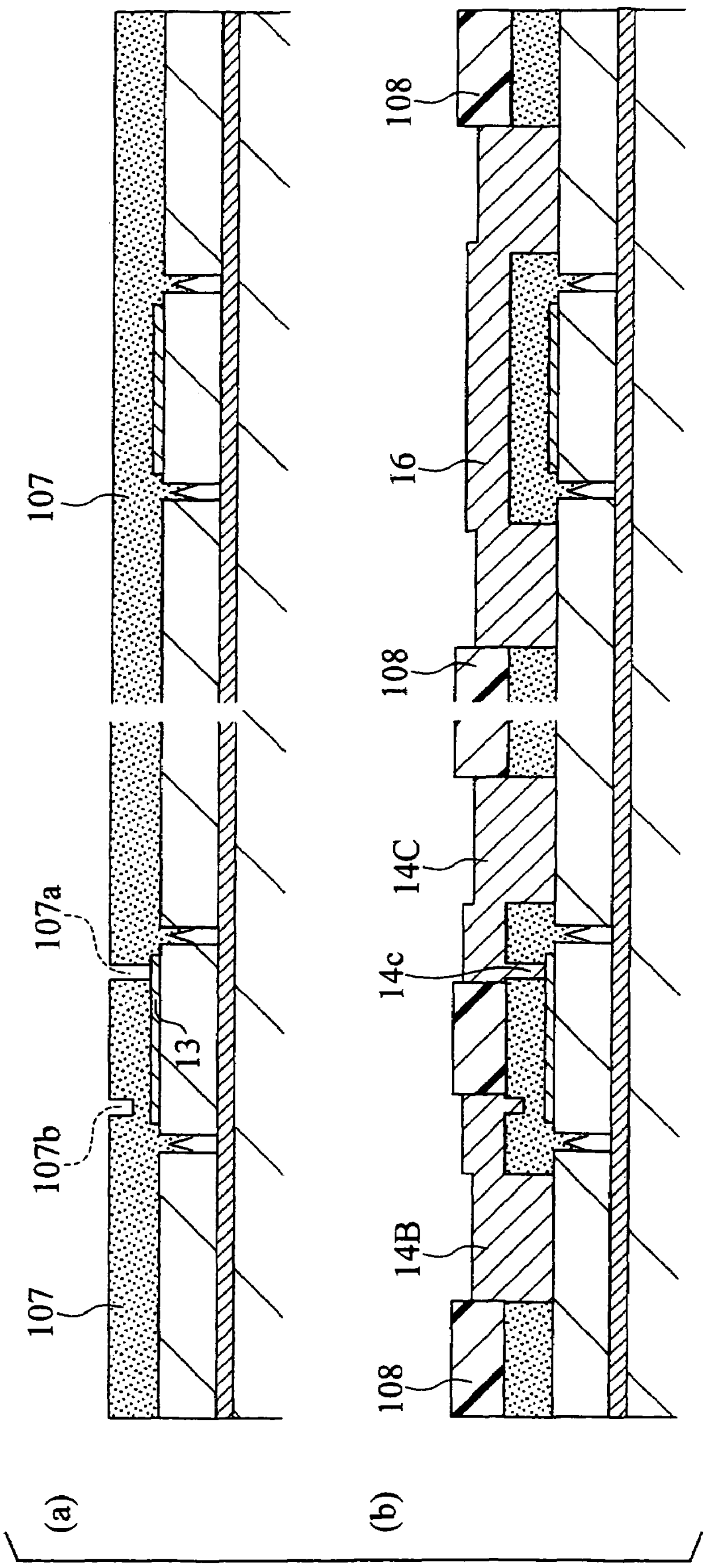
FIG. 17 shows, in section, steps of a manufacturing process of the micro-switching device shown in FIG. 14.

To manufacture the micro-switching device X2 thus configured, a recessed portion or through-hole 107$a$ is formed in the sacrifice layer 107 as shown in FIG. 17($a$), by using the same manufacturing process as that employed for the micro-switching device X1 described referring to FIG. 8($a$). Then by the process described referring to FIG. 9($a$), the projecting portion 14$c$ is formed in the through-hole 107$a$, and at the same time the contact electrode 14C is also formed as shown in FIG. 17($b$). The remaining steps may be performed similarly to those described on the manufacturing process of the micro-switching device X1.

In the micro-switching device X2, when a potential is applied to the driving electrode 15, static attraction is generated between the driving electrodes 15, 16. When the applied potential is sufficiently high, the movable portion 12 moves, or is elastically deformed, until the contact portion 13$b$' of the contact electrode 13 and the contact portion 14$b$' on the projecting portion 14$b$, of the contact electrode 14B come into mutual contact. That is how the micro-switching device X2 enters the closed state. Under the closed state, the contact electrodes 13 serves as an electrical bridge between the pair of contact electrodes 14B, 14C, thereby allowing a current to run between the contact electrodes 14B, 14C. Such closing action of the switch can realize, for example, an on state of a high frequency signal.

On the other hand, in the micro-switching device X2 under the closed state, disconnecting the potential to the driving electrode 15, thereby canceling the static attraction acting between the driving electrodes 15, 16 causes the movable portion 12 to return to its natural state, so that the contact portion 13$b$' of the contact electrode 13 is separated from the contact portion 14$b$' on the projecting portion 14$b$ of the contact electrode 14B. That is how the micro-switching device X2 enters the open state as shown in FIG. 15. Under the -open state, the pair of contact electrodes 14B, 14C is electrically isolated and hence the current is inhibited from running between the contact electrodes 14B, 14C. Such opening action of the switch can realize, for example, an off state of the high frequency signal. The micro-switching device X2 in such open state can be again switched to the closed state or the on state, by the above closing action.

In the micro-switching device X2, the contact portion 13$b$' of the contact electrode 13 and the contact portion 14$c$' on the projecting portion 14$c$ of the contact electrode 14C are in mutual contact in the open state (off state). In the contact electrode 13 of the micro-switching device X2, configured to form such open state, and the movable portion 12 to which the contact electrode 13 is joined, the freedom of deformation due to the internal stress in the contact electrode 13 is depressed, compared with the case where the contact portions 13$a$' and 14$c$' are not in contact but spaced from each other. Accordingly, the micro-switching device X2 is capable of suppressing the fluctuation in orientation of the contact electrode 13 (movable contact electrode) toward the contact electrodes 14B, 14C (stationary contact electrode). Suppressing the fluctuation in orientation of the contact electrode 13 toward the contact electrodes 14B, 14C contributes to reducing the driving voltage of the micro-switching device X2.

Figure 18:
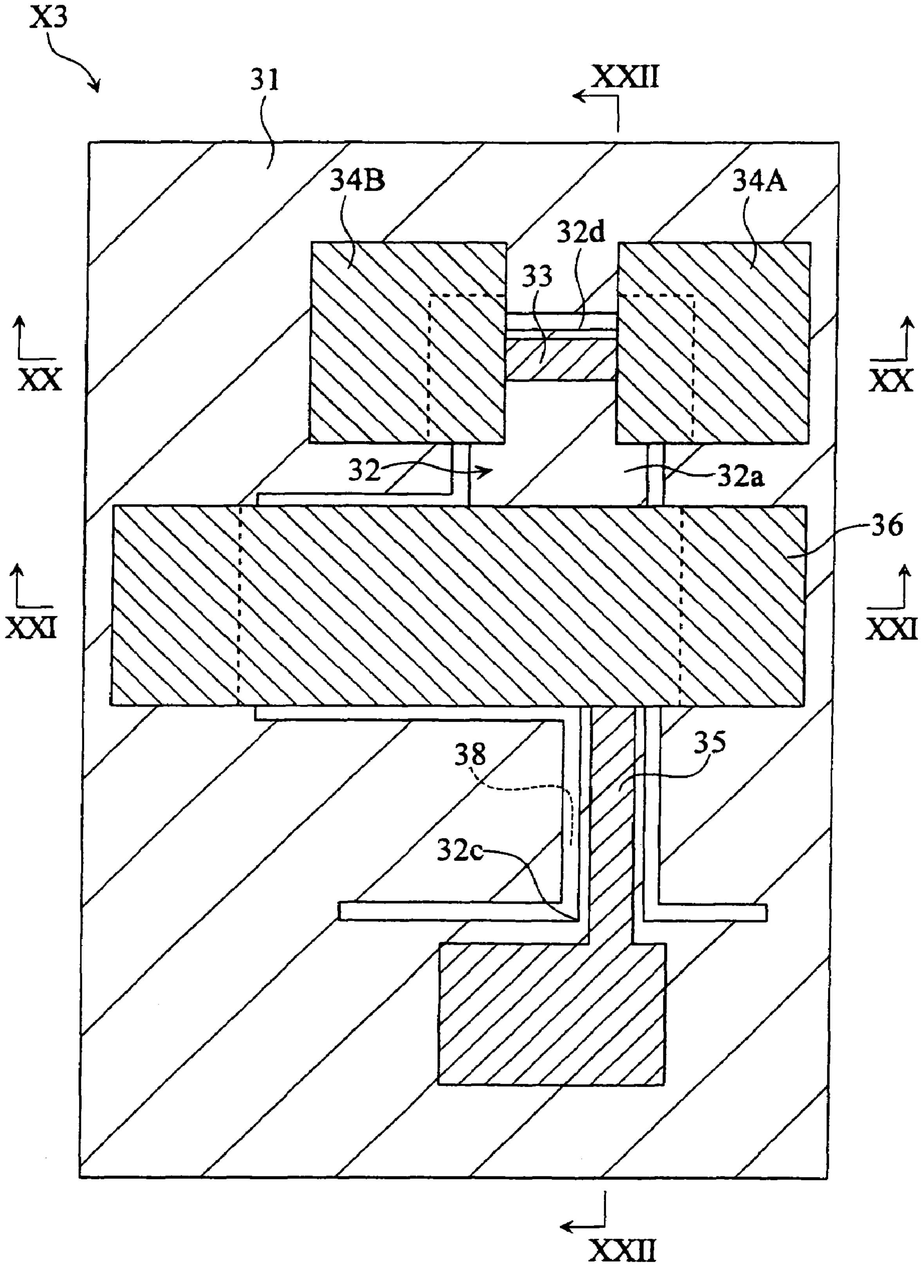
FIG. 18 is a plan view showing a micro-switching device according to a third embodiment of the present invention.
Figure 19:
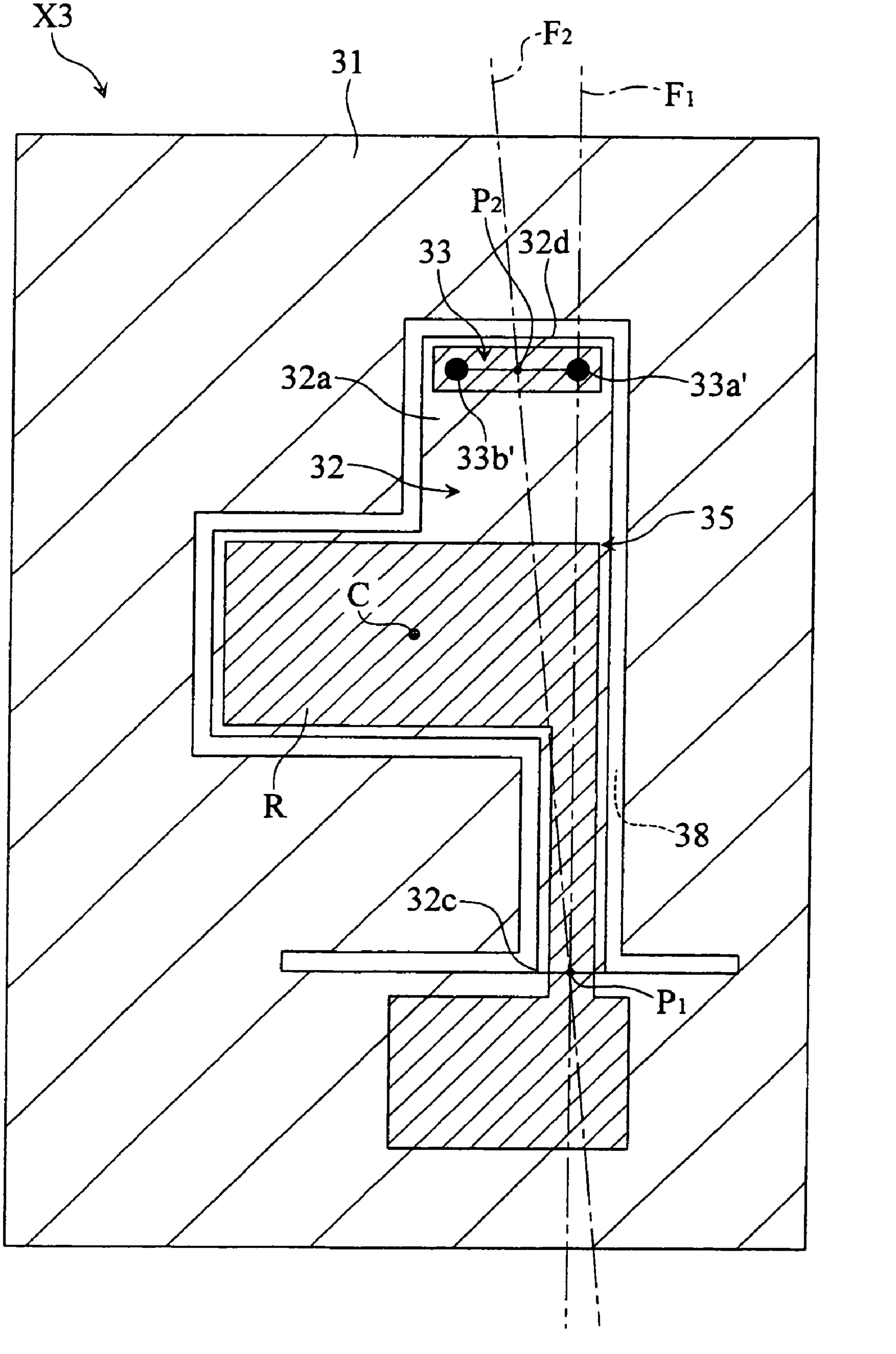
FIG. 19 is a plan view showing the micro-switching device of FIG. 18, with some parts omitted.
Figure 20:
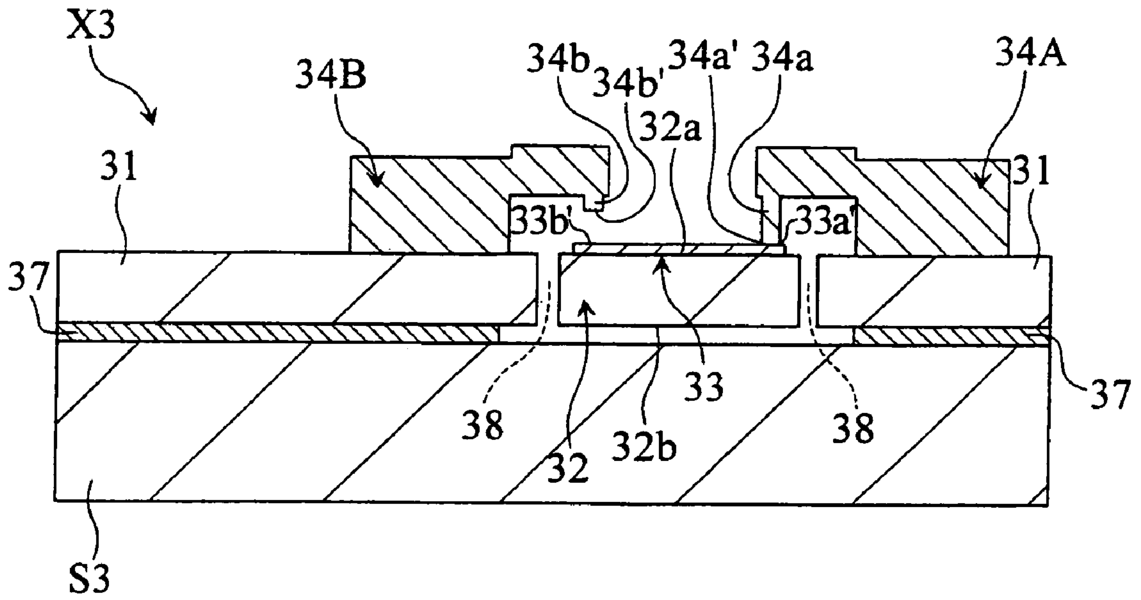
FIG. 20 is a cross-sectional view taken along a line XX-XX in FIG. 18.
Figure 21:
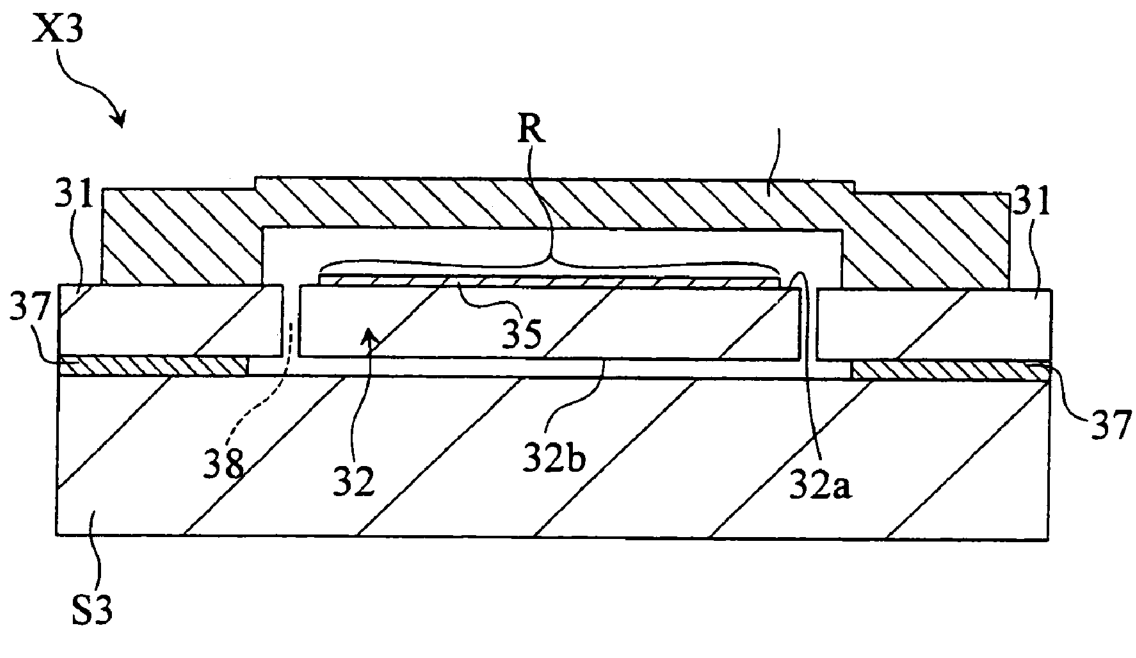
FIG. 21 is a cross-sectional view taken along a line XXI-XXI in FIG. 18.
Figure 22:
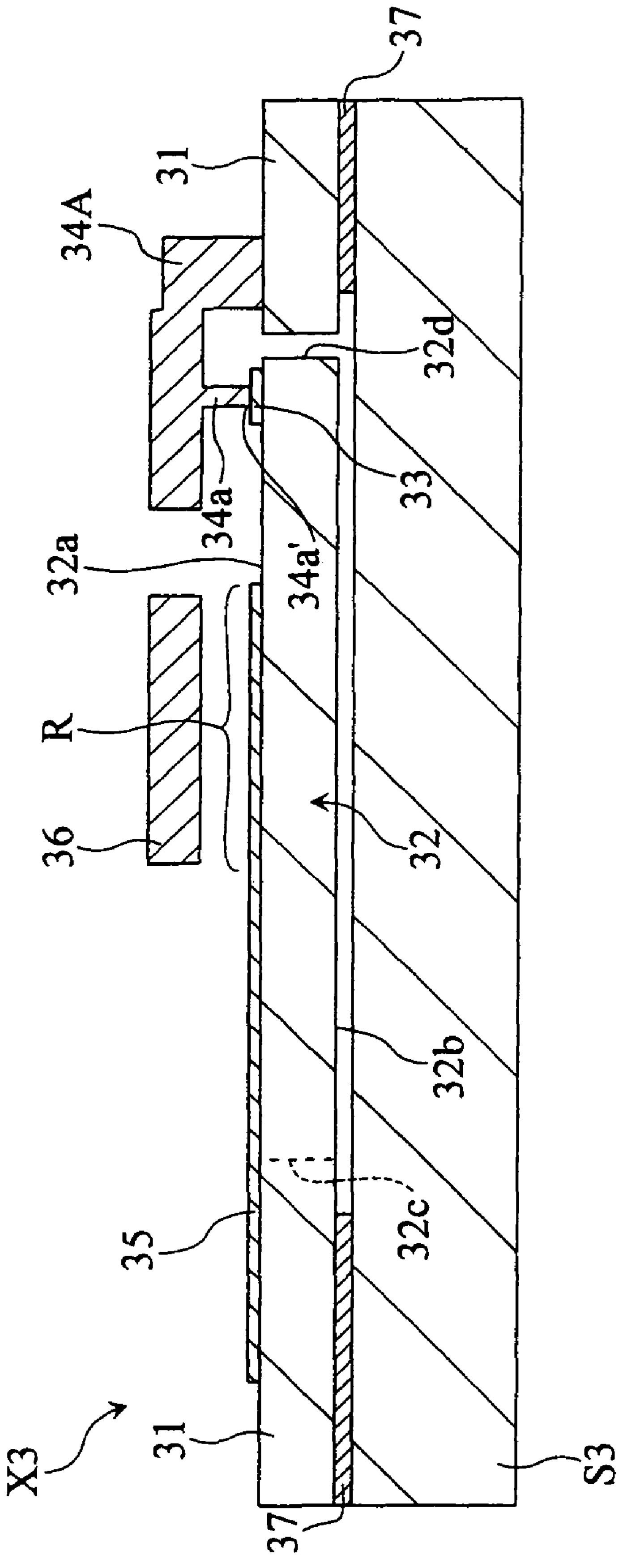
FIG. 22 is a cross-sectional view taken along a line XXII-XXII in FIG. 18.

FIGS. 18 to 22 depict a micro-switching device X3 according to a third embodiment of the present invention. FIG. 18 is a plan view showing the micro-switching device X3, and FIG. 19 is a fragmentary plan view thereof. FIGS. 20 to 22 are cross-sectional views taken along lines XX-XX, XXI-XXI, and XXII-XXII in FIG. 18, respectively.

The micro-switching device X3 includes a base substrate S3, a fixing portion 31, a movable portion 32, a contact electrode 33, a pair of contact electrodes 34A, 34B (not shown in FIG. 19), a driving electrodes 35, and a driving electrodes 36 (not shown in FIG. 19).

The fixing portion 31 is joined to the base substrate S3 via a partition layer 37, as shown in FIGS. 20 to 22. The fixing portion 31 is formed of a silicon material such as monocrystalline silicon. It is preferable that the silicon material constituting the fixing portion 31 has resistivity not lower than 1000 Ω·cm. The partition layer 37 is formed of silicon dioxide, for example.

The movable portion 32 includes, as shown in FIGS. 18, 19 and 22, a first surface 32*a* and a second surface 32*b*, as well as a stationary end 32*c* fixed to the fixing portion 31 and a free end 32*d*, and is disposed to extend along the base substrate S3 from the stationary end 32*a*, and surrounded by the fixing portion 31 via a slit 38. The movable portion 32 is formed of, for example, monocrystalline silicon.

The contact electrode 33 is a movable contact electrode and, as shown in FIG. 19, is located on the first surface 32*a* of the movable portion 32, at a position close to the free end 32*d* (in other words, the contact electrode 33 is spaced from the stationary end 32*c* of the movable portion 32). The contact electrode 33 includes contact portions 33*a*' 33*b*'. For the sake of explicitness of the drawing, the contact portions 33*a*', 33*b*' are indicated by solid circles in FIG. 19. The contact electrode 33 is formed of an appropriate conductive material, and has a multilayer structure including, for example, a Mo underlying layer and an Au layer provided thereon.

The contact electrodes 34A, 34B are first and second stationary contact electrodes respectively, each being formed on the fixing portion 31 and including a downward projecting portion 34*a*, 34*b* as shown in FIGS. 20 and 22. The tip portion of the projecting portion 34*a* serves as a contact portion 34*a*', which is either disposed in contact with the contact portion 33*a*' on the contact electrode 33 as the contact portion 14*a*' is in contact with the contact portion 13*a*' in the micro-switching device X1 according to the first embodiment, or joined to the contact portion 33*a*' on the contact electrode 33 as the contact portion 14*c*' is joined to the contact portion 13*c*' in the micro-switching device X2 according to the second embodiment. The tip portion of the projecting portion 34*b* serves as a contact portion 34*b*', disposed to face the contact portion 33*b*' on the contact electrode 33. The projecting portion 34*a* is longer in projecting length than the projecting portion 34*b*. The contact electrodes 34A, 34B are connected to a predetermined circuit to be switched, via an interconnector (not shown). The contact electrodes 34A, 34B may be formed of the same material as that of the contact electrode 33.

The driving electrode 35 is, as shown in FIG. 19, disposed to extend over a part of the movable portion 32 and of the fixing portion 31. The driving electrode 35 may be formed of Au.

The driving electrode 36 serves to generate static attraction (driving force) in the space between the driving electrode 36 and the driving electrode 35, and is formed so as to span over the driving electrode 35 with the respective ends connected to the fixing portion 31, as shown in FIG. 21. The driving electrode 36 is grounded by a conductor (not shown). The driving electrode 36 may be formed of the same material as that of the contact electrode 35.

The driving electrodes 35, 36 constitute an electrostatic driving mechanism in the micro-switching device X3, and include a driving force generation region R on the first surface 32*a* of the movable portion 32, as shown in FIG. 19. The driving force generation region R is, as shown in FIG. 21, a region of the driving electrode 35 opposing the driving electrode 36.

In the micro-switching device X3, as seen from FIG. 19, the movable portion 32 has an asymmetrical shape. For example, the movable portion 32 is asymmetric such that the center of gravity thereof is located on the same side as the contact portion 33*b*' of the contact electrode 33, with respect to an imaginary line $F_1$ passing through the stationary end 32*c* of the movable portion 32 and the contact portion 33*a*' of the contact electrode 33. Further, in the micro-switching device X3, the location of the contact portions 33*a*', 33*b*' of the contact electrode 33 (i.e. location of the contact portions 34*a*', 34*b*' of the contact electrodes 34A, 34B), as well as-the location of the driving force generation region R in the driving mechanism constituted of the driving electrodes 35, 36 are also asymmetric. For example, the center of gravity C of the driving force generation region R is closer to the contact portion 33*b*' than to the contact portion 33*a*' of the contact electrode 33. The distance between the stationary end 32*c* of the movable portion 32 and the contact portion 33*b*' of the contact electrode 33 is longer than the distance between the stationary end 32*c* and the contact portion 33*a*' of the contact electrode 33. The center of gravity C of the driving force generation region R is located on the same side as the contact portion 33*b*', with respect to an imaginary line $F_2$ passing through the midpoint $P_1$ of the length of the stationary end 32*c* of the movable portion 32 and the midpoint $P_2$ between the contact portions 33*a*', 33*b*' of the contact electrode 33.

In the micro-switching device X3 thus configured, when a potential is applied to the driving electrode 35, static attraction is generated between the driving electrodes 35, 36. When the applied potential is sufficiently high, the movable portion 32 moves, or is elastically deformed, until the contact portion 33*b*' of the contact electrode 33 and the contact portion 34*b*' on the projecting portion 34*b* of the contact electrode 34B come into mutual contact. That is how the micro-switching device X3 enters the closed state. Under the closed state, the contact electrodes 33 serves as an electrical bridge between the pair of contact electrodes 34A, 34B, thereby allowing a current to run between the contact electrodes 34A, 34B. Such closing action of the switch can realize, for example, an on state of a high frequency signal.

On the other hand, in the micro-switching device X3 under the closed state, disconnecting the potential to the driving electrode 35, thereby canceling the static attraction acting between the driving electrodes 35, 36 causes the movable portion 32 to return to its natural state, so that the-contact portion 33*b*' of the contact electrode 33 is separated from the contact portion 34*b*' on the projecting portion 34*b* of the contact electrode 34B. That is how the micro-switching device X3 enters the open state as shown in FIGS. 20 and 22. Under the open state, the pair of contact electrodes 34A, 34B is electrically isolated and hence the current is inhibited from running between the contact electrodes 34A, 34B. Such opening action of the switch can realize, for example, an off state of the high frequency signal. The micro-switching device X3 in such open state can be again switched to the closed state or the on state, by the above closing action.

In the micro-switching device X3, the contact portion 33*b*' of the contact electrode 33 and the contact portion 34*a*' on the projecting portion 34*a* of the contact electrode 34A are in mutual contact, or joined to each other, in the open state (off state). In the contact electrode 33 of the micro-switching device X3, configured to form such open state, and the movable portion 32 to which the contact electrode 33 is joined, the freedom of deformation due to the internal stress in the contact electrode 33 is depressed, compared with the case where the contact portions 33*a*' and 34*a*' are not in contact or joined, but spaced from each other. Accordingly, the micro-switching device X3 is. capable of suppressing the fluctuation in orientation of the contact electrode 33 (movable contact electrode) toward the contact electrodes 34A, 34B (stationary contact electrode). Suppressing the fluctuation in orientation of the contact electrode 33 toward the contact electrodes 34A, 34B contributes to reducing the driving voltage of the micro-switching device X3.

When the micro-switching device X3 is in transit from the open state to the closed state, mainly the region of the movable portion 32 that extends from the driving force generation region R to the stationary end 32*c* will undergo torsional deformation. This deformation can be said to be caused by a force exerted on the center of gravity C of the driving force generation region R so as to rotate the movable portion 32 around a fixed axis or rotational axis represented by the imaginary line $F_1$ passing through the stationary end 32*c* of the movable portion 32 and the contact point between the contact electrodes 33, 34A, as shown in FIG. 19. It is advantageous to have the center of gravity C of the driving force generation region R at a position closer to the contact portion 33*b*' than to the contact portion 33*a*' of the contact electrode 33, since this configuration ensures that a long distance is provided between the center of gravity C of the driving force generation region R (point of effort) and the foregoing axis (imaginary line $F_1$). The longer the distance between the center of gravity C of the driving force generation region R (point of effort) and the foregoing axis is, the greater momentum can be generated at the center of gravity C of the driving force generation region R while the movable portion 32 is deformed until the contact electrode 33 and the contact electrode 34B (more precisely, the projecting portion 34*b* and the contact portion 34*b*') come into mutual contact, which permits reducing the minimal driving force (minimal static attraction) that has to be generated by the driving mechanism (driving electrodes 35, 36) in order to achieve the closed state. The smaller the minimal driving force is, the lower minimal voltage is required to be applied to the driving mechanism in order to achieve the closed state. The micro-switching device X3 is, therefore, appropriate for reducing the driving voltage to be applied to the driving mechanism in order to achieve the closed state.

The micro-switching device X3 includes, as -described above, asymmetrical configuration in the shape of the movable portion 32, the location of the contact portions 33*a*', 33*b*' of the contact electrode 33 (i.e. location of the contact portions 34*a*', 34*b*' of the contact electrodes 34A, 34B), and the location of the driving force generation region R in the driving mechanism constituted of the driving electrodes 35, 36. For example, the movable portion 32 is asymmetric such that the center of gravity thereof is located on the same side as the contact portion 33*b*' of the contact electrode 33, with respect to an imaginary line $F_1$ passing through the stationary end 32*c* of the movable portion 32 and the contact portion 33*a*' of the contact electrode 33. The center of gravity C of the driving force generation region R is closer to the contact portion 33*b*' than to the contact portion 33*a*' of the contact electrode 33. The distance between the stationary end 32*c* of the movable portion 32 and the contact portion 33*b*' of the contact electrode 33 is longer than the distance between the stationary end 32*c* and the contact portion 33*a*' of the contact electrode 33. The center of gravity C of the driving force generation region R is located on the same side as the contact portion 33*b*', with respect to an imaginary line $F_2$ passing through the midpoint $P_1$ of the length of the stationary end 32*c* of the movable portion 32 and the midpoint $P_2$ between the contact portions 33*a*', 33*b*' of the contact electrode 33. Such asymmetrical configuration is advantageous for ensuring a sufficiently long distance between the center of gravity C of the driving force generation region R (point of effort) on the movable portion 32 and the foregoing fixed axis (imaginary line F1).

Figure 23:
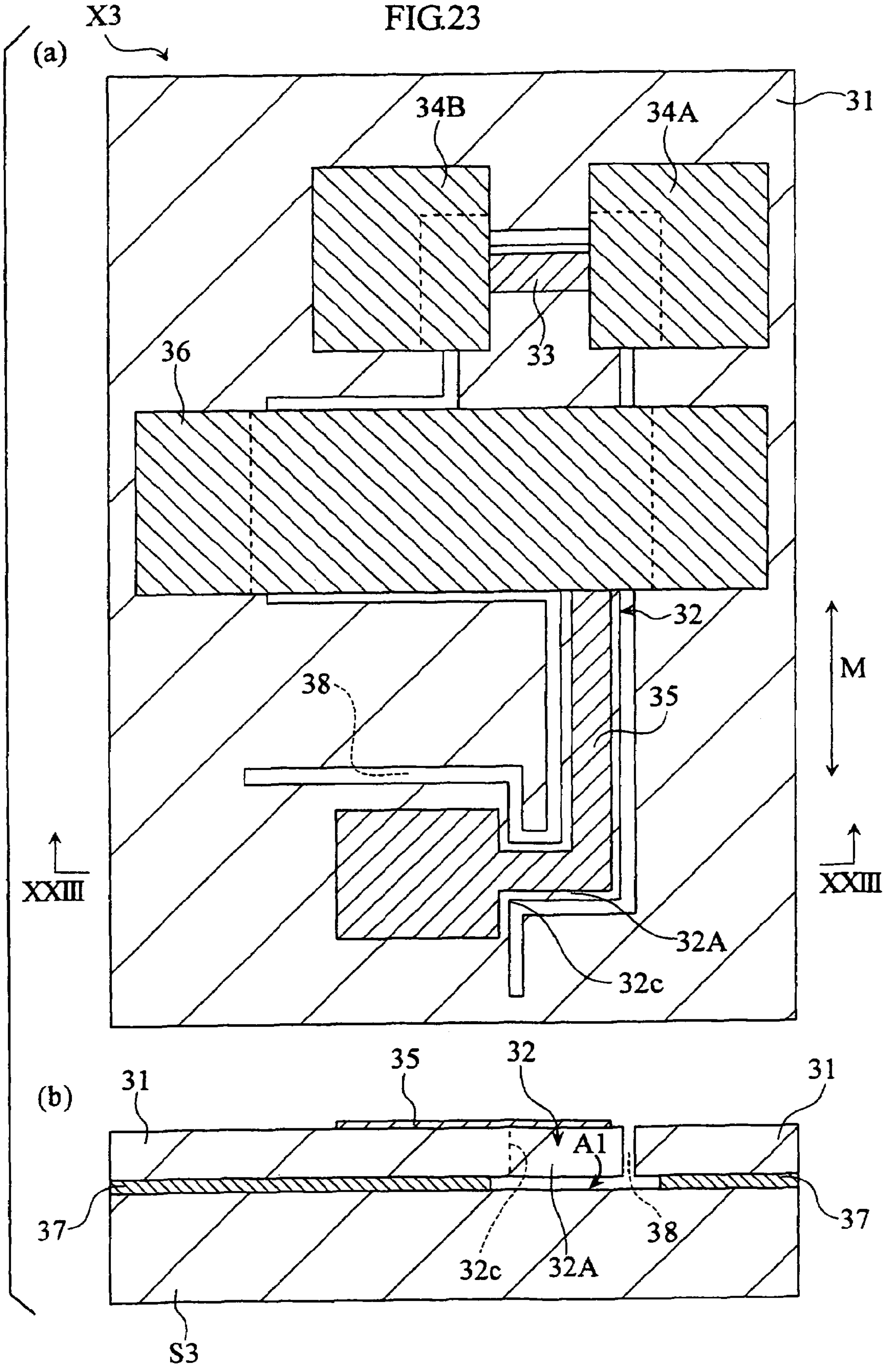
FIG. 23 illustrates a variation of the micro-switching device shown in FIG. 1.

The movable portion 32 may be bent as shown in FIG. 23(*a*). The movable portion 32 shown in FIG. 23(*a*) includes a region 32A directly fixed to the fixing portion 31 at the stationary end 32*c*, and extending in a direction perpendicular to the major extension direction M of the movable portion 32.

In an instance where the movable portion 32 has a bent structure as described above, the region 32A (see the arrow A1 in FIG. 23(*b*)), which is connected to the fixing portion 31 via the stationary end 32*c*, mainly undergoes bending deformation during the ON transition of the micro-switching device X3 to change from the open state to the closed state. For this closing action, it can be assumed that a force acts on the center of gravity C of the driving force generation region R, thereby rotating the movable portion 32 around a fixed axis or rotational axis represented by the imaginary line passing through the stationary end 32*c* of the movable portion 32 and the contact point between the contact electrodes 33, 34A.

Advantageously the closing action by the bending of the portion 32A requires for a smaller driving force to be generated by the driving mechanism (driving electrode 35, 36) than the closing action taken by the movable portion 32 shown in FIG. 19, in which case the movable portion 32 undergoes torsional deformation at the region from the driving force generation region R to the stationary end 32*c*. In light of this, the bent structure of the movable portion 32 according to this variation contributes to reducing the driving voltage applied to the driving mechanism for achieving the closed state of the micro-switching device X3.

Figure 24:
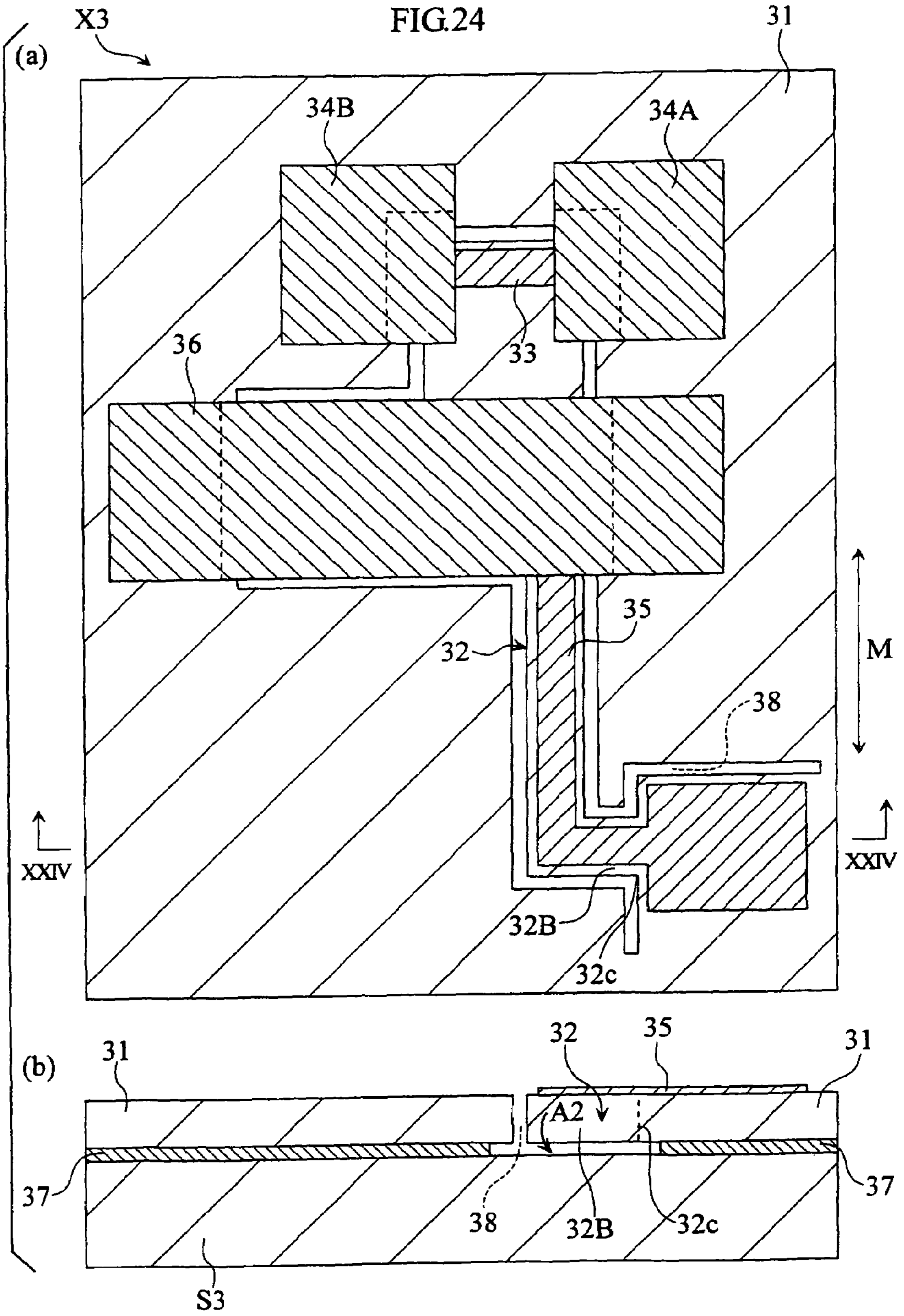
FIG. 24 illustrates another variation of the micro-switching device shown in FIG. 1.
Figure 25:
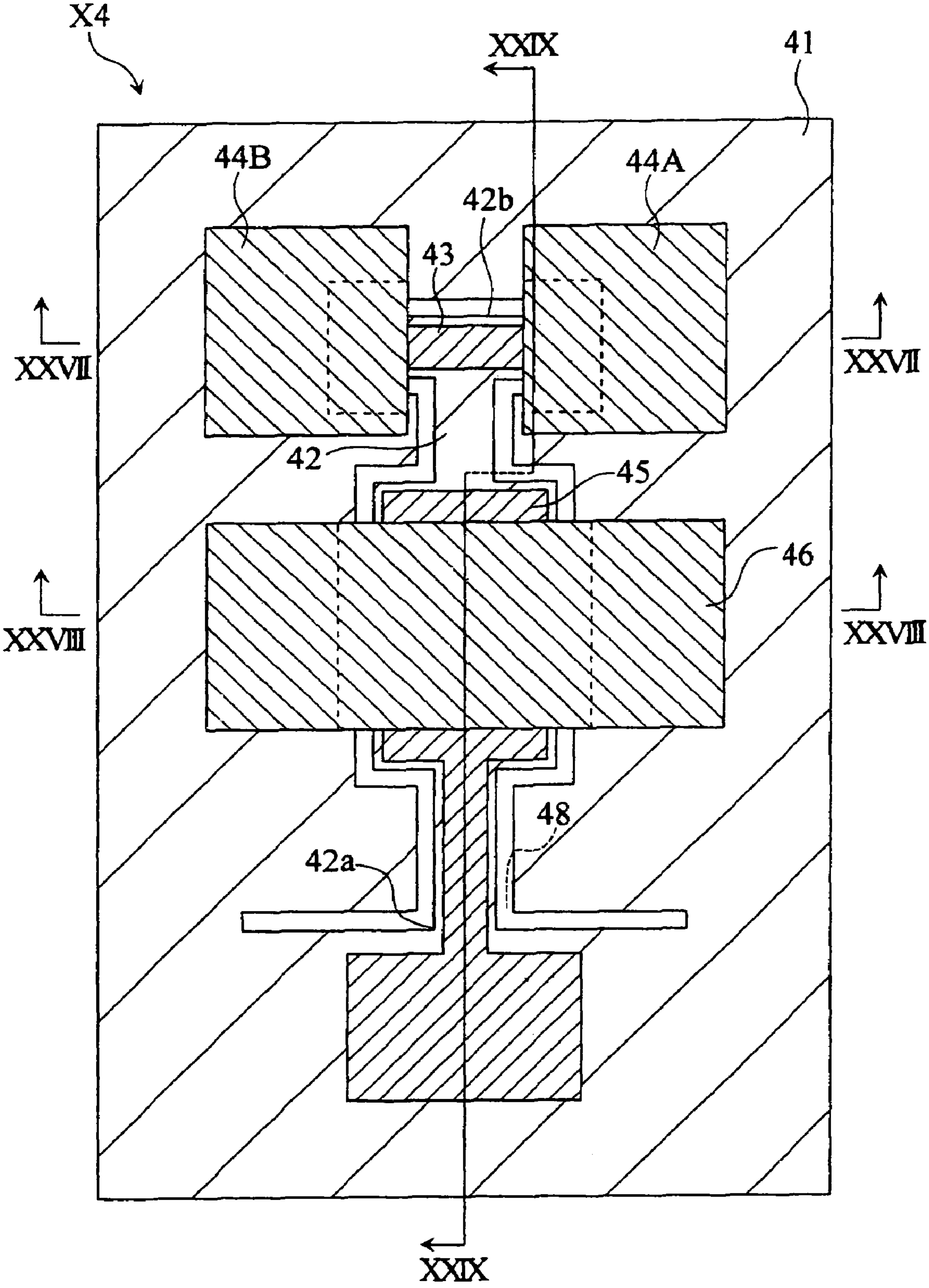
FIG.25 Prior Art
FIG. 25 is a plan view showing a conventional micro-switching device.
Figure 26:
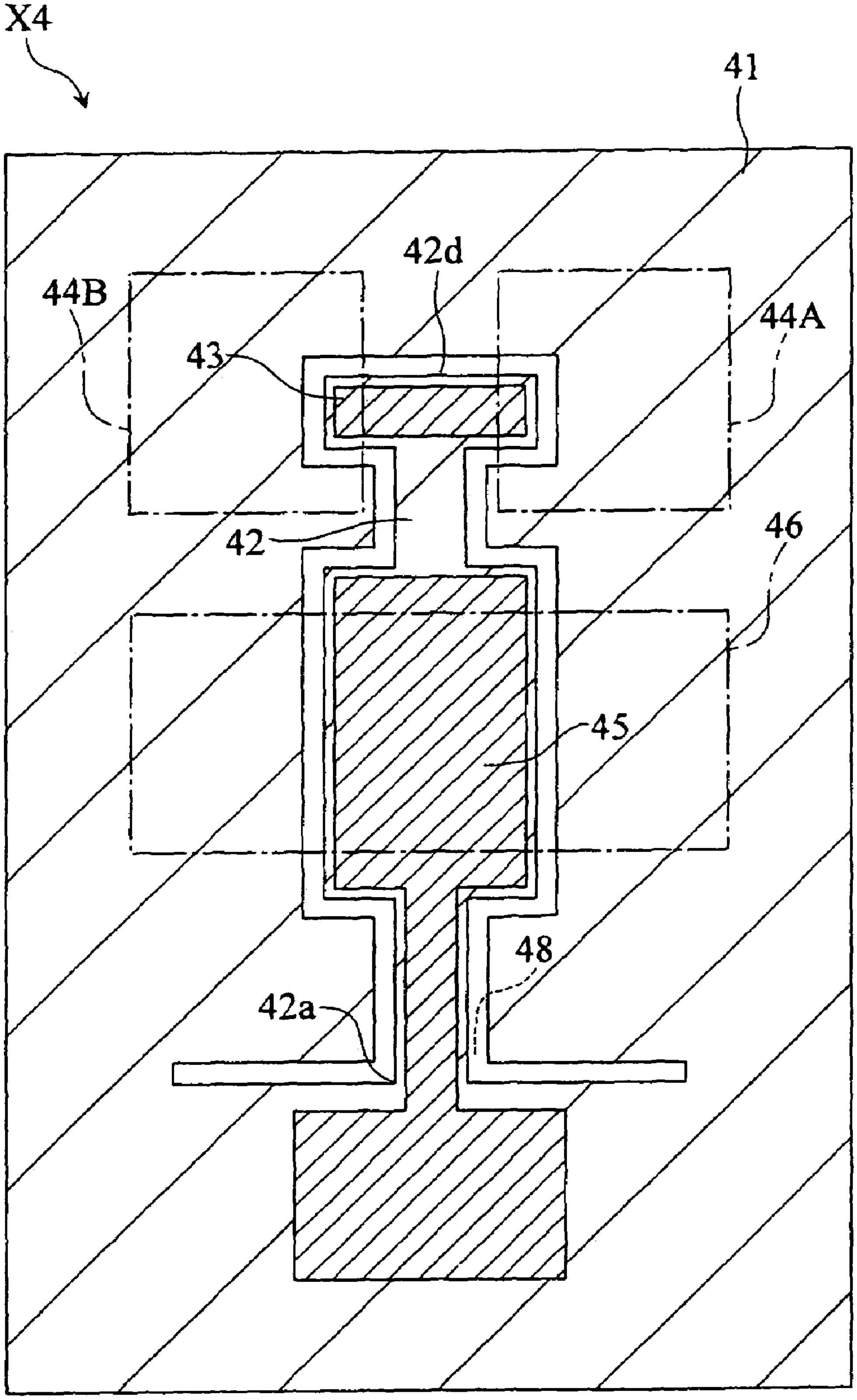
FIG.26 Prior Art
FIG. 26 is a plan view showing the micro-switching device of FIG. 25, with some parts omitted.
Figure 27:
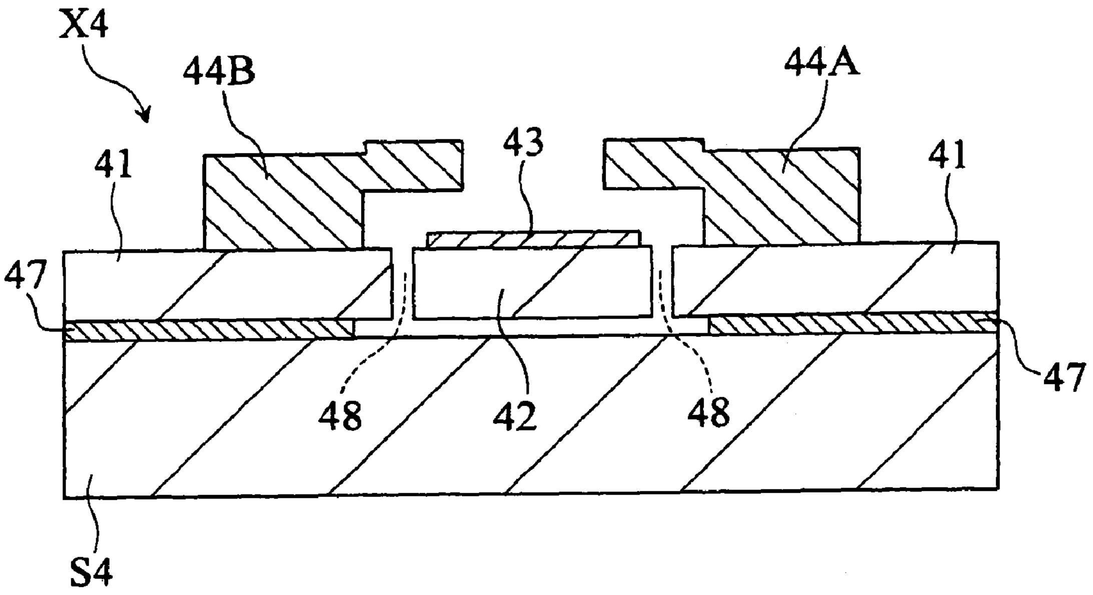
FIG.27 Prior Art
FIG. 27 is a cross-sectional view taken along a line XXVII-XXVII in FIG. 25.
Figure 28:
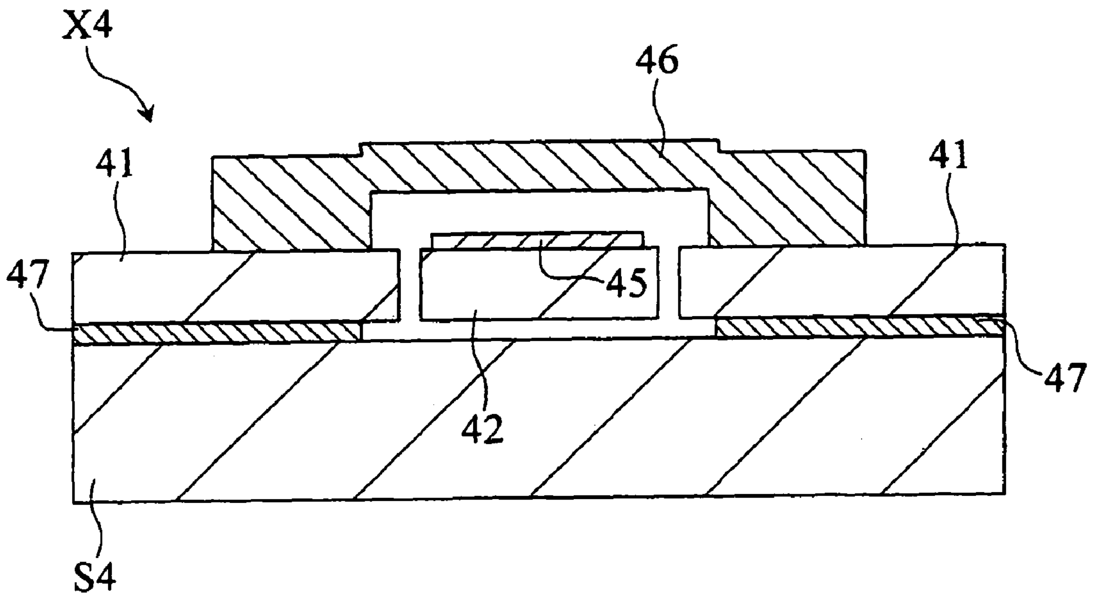
FIG.28 Prior Art
FIG. 28 is a cross-sectional view taken along a line XXVIII-XXVIII in FIG. 25.
Figure 29:
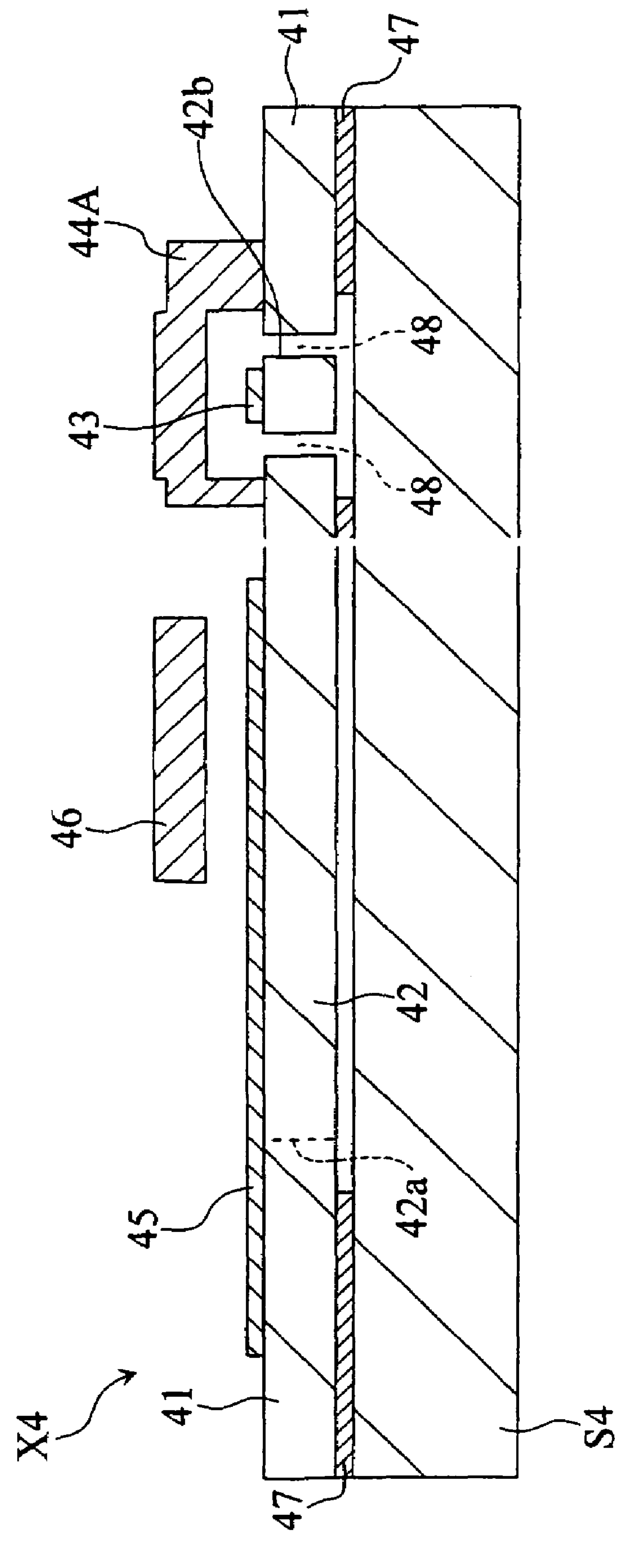
FIG.29 Prior Art
FIG. 29 is a cross-sectional view taken along a line XXIX-XXIX in FIG. 25.
Figure 30:
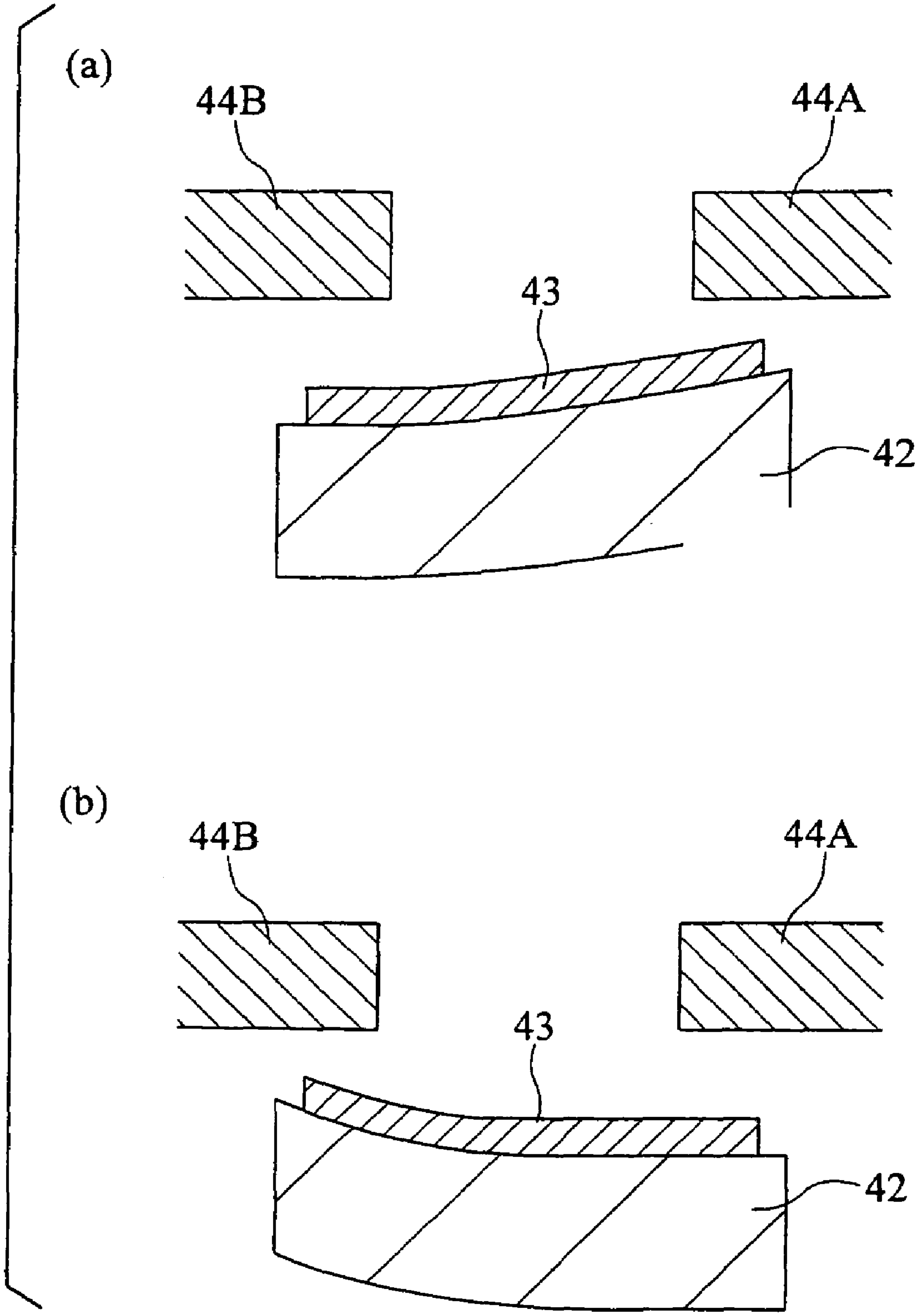
FIG.30 Prior Art
FIG. 30 illustrates, in section, how the conventional movable portion, with a contact electrode formed thereon, deforms (depicted in an exaggerated manner).

The movable portion 32 may have another bending configuration as shown in FIG. 24(*a*). The movable portion 32 shown in FIG. 24(*a*) includes a portion 32B directly fixed to the fixing portion 31 at the stationary end 32*c*, and extending in a direction intersecting the major extension direction M of the movable portion 32.

In the case where the movable portion 32 is thus bent, during the transition of the micro-switching device X3 from the open state to the closed state, mainly the region 32B of the movable portion 32 fixed to the fixing portion 31 at the stationary end 32*c* undergoes bending deformation, as indicated by an arrow A2 in FIG. 24(*b*). For this closing action, it can be assumed again that a force is exerted on the center of gravity C of the driving force generation region R, thereby rotating the movable portion 32 around a fixed axis or rotational axis represented by the imaginary line passing through the stationary end 32*c* of the movable portion 32 and the contact point between the contact electrodes 33, 34A.

The closing action of bending the portion 32B according to the above variation is also advantageous for reducing the driving force to be generated by the driving mechanism (driving electrode 35, 36). Further, this variation facilitates ensuring that a longer distance can be provided between the center of gravity C of the driving force generation region R (point of effort) and the fixed axis or rotational axis for the closing action, than the variation shown in FIG. 23. Accordingly, a greater momentum can be generated upon application of force at the center of gravity C of the driving force generation region R, which is advantageous to bringing the contact electrode 33 and the contact electrode 34B (the projecting portion 34*b* and the contact portion 34*b*') into contact with each other by a smaller driving force (electrostatic attraction) generated by the driving mechanism (driving electrodes 35, 36). In summary, the bent structure of the movable portion 32 according to this variation contributes to reducing the driving voltage to be applied to the driving mechanism in order to achieve the closed state in the micro-switching device X3.

The invention claimed is:

1. A micro-switching device comprising:

a fixing portion;

a movable portion including a first surface and a second surface opposite to the first surface, the movable portion including a stationary end fixed to the fixing portion;

a movable contact electrode provided on the first surface of the movable portion and including a first contact portion and a second contact portion;

a first stationary contact electrode including a third contact portion coming into contact with the first contact portion of the movable contact electrode, the first stationary contact electrode being joined to the fixing portion;

a second stationary contact electrode including a fourth contact portion facing the second contact portion of the movable contact electrode, the second stationary contact electrode being joined to the fixing portion; and a driving mechanism for moving the movable portion to cause the second contact portion and the fourth contact portion to come into contact with each other;

wherein when the moveable portion is in a natural state, the first contact portion is held in contact with the third contact portion, and the second contact portion is separated from the fourth contact portion.

2. The micro-switching device according to claim 1, wherein the first contact portion of the movable contact electrode and the third contact portion of the first stationary contact electrode are connected to each other.

3. The micro-switching device according to claim 1, wherein the movable contact electrode comprises a first projecting portion and a second projecting portion, the first projecting portion including the first contact portion, the second projecting portion having a shorter projecting length than the first projecting portion and including the second contact portion.

4. The micro-switching device according to claim 1, wherein the first stationary contact electrode comprises a third projecting portion including the third contact portion, the second stationary contact electrode comprising a fourth projecting portion having a shorter projecting length than the third projecting portion and including the fourth contact portion.

5. The micro-switching device according to claim 1, wherein the movable contact electrode is spaced from the stationary end in a offset direction on the first surface of the movable portion, the first contact portion and the second contact portion being spaced in a direction intersecting the offset direction, the driving mechanism including a driving force generation region on the first surface of the movable portion, the driving force generation region having a center of gravity closer to the second contact portion than to the first contact portion of the movable contact electrode.

6. The micro-switching device according to claim 5, wherein a distance between the stationary end of the movable portion and the first contact portion of the movable contact electrode is different from a distance between the stationary end and the second contact portion.

7. The micro-switching device according to claim 5, wherein the movable portion has a bent structure.

8. The micro-switching device according to claim 5, wherein the center of gravity of the driving force generation region and the second contact portion are located on a same side with respect to an imaginary line passing through a midpoint of the length of the stationary end and a midpoint between the first contact portion and the second contact portion.

9. The micro-switching device according to claim 1, wherein the driving mechanism includes a movable driving electrode and a stationary driving electrode, the movable driving electrode being provided on the first surface of the movable portion, the stationary driving electrode being joined to the fixing portion and having a portion opposing the movable driving electrode.

10. The micro-switching device according to claim 1, wherein the driving mechanism includes a multilayer structure made up of a first electrode layer provided on the first surface of the movable portion, a second electrode layer, and a piezoelectric layer arranged between the first electrode layer and the second electrode layer.

11. The micro-switching device according to claim 1, wherein the driving mechanism includes a multilayer structure made up of a plurality of material layers provided on the first surface of the movable portion, each of the material layers having a different thermal expansion coefficient.

12. A method of manufacturing a micro-switching device comprising: a fixing portion; a movable portion including a first surface and a second surface opposite to the first surface, the movable portion including a stationary end fixed to the fixing portion; a movable contact electrode provided on the first surface of the movable portion and including a first contact portion and a second contact portion; a first stationary contact electrode including a third contact portion coming into contact with the first contact portion of the movable contact electrode, the first stationary contact electrode being joined to the fixing portion; and a second stationary contact electrode including a fourth contact portion facing the second contact portion of the movable contact electrode, the second stationary contact electrode being joined to the fixing portion;

the method comprising the steps of:

forming the movable contact electrode on a substrate;

forming a sacrifice layer on the substrate to cover the movable contact electrode;

forming a first recess and a second recess in the sacrifice layer corresponding in position to the movable contact electrode, the second recess being shallower than the first recess;

forming the first stationary contact electrode having a portion opposing the movable contact electrode via the sacrifice layer, the first stationary contact electrode filling the first recess;

forming the second stationary contact electrode having a portion opposing the movable contact electrode via the. sacrifice layer, the second stationary contact electrode filling the second recess; and removing the sacrifice layer.

13. A method of manufacturing a micro-switching device comprising: a fixing portion; a movable portion including a first surface and a second surface opposite to the first surface, the movable portion including a stationary end fixed to the fixing portion; a movable contact electrode provided on the first surface of the movable portion and including a first contact portion and a second contact portion; a first stationary contact electrode including a third contact portion connected to the first contact portion of the movable contact electrode, the first stationary contact electrode being joined to the fixing portion; and a second stationary contact electrode including a fourth contact portion facing the second contact portion of the movable contact electrode, the second stationary contact electrode being joined to the fixing portion;

the method comprising the steps of:

forming the movable contact electrode on a substrate;

forming a sacrifice layer on the substrate to cover the movable contact electrode;

forming a through-hole and a recess in the sacrifice layer corresponding in position to the movable contact electrode, the through-hole partially exposing the movable portion;

forming the first stationary contact electrode to have a portion opposing the movable contact electrode via the sacrifice layer, the first stationary contact electrode filling the through-hole;

forming the second stationary contact electrode to have a portion opposing the movable contact electrode via the sacrifice layer, the second stationary contact electrode filling the recess; and removing the sacrifice layer.

14. The micro-switching device according to claim 1, wherein the natural state is an elastically relaxed state.

* * * * *